(12) United States Patent
Ogiwara et al.

(10) Patent No.: US 11,103,959 B2
(45) Date of Patent: Aug. 31, 2021

(54) LASER PROCESSING METHOD, AND LASER PROCESSING DEVICE

(71) Applicant: HAMAMATSU PHOTONICS K.K., Hamamatsu (JP)

(72) Inventors: Takafumi Ogiwara, Hamamatsu (JP); Yuta Kondoh, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 415 days.

(21) Appl. No.: 15/763,915

(22) PCT Filed: Aug. 9, 2016

(86) PCT No.: PCT/JP2016/073468
§ 371 (c)(1),
(2) Date: Mar. 28, 2018

(87) PCT Pub. No.: WO2017/156744
PCT Pub. Date: Apr. 6, 2017

(65) Prior Publication Data
US 2018/0281116 A1    Oct. 4, 2018

(30) Foreign Application Priority Data

Sep. 29, 2015 (JP) ............................. JP2015-191096

(51) Int. Cl.
*B23K 26/53* (2014.01)
*B23K 26/04* (2014.01)
(Continued)

(52) U.S. Cl.
CPC .......... *B23K 26/53* (2015.10); *B23K 26/0006* (2013.01); *B23K 26/04* (2013.01);
(Continued)

(58) Field of Classification Search
CPC ........ B23K 26/53; B23K 26/04; B23K 26/08; B23K 26/048; B23K 2103/56;
(Continued)

(56) References Cited

U.S. PATENT DOCUMENTS 7,566,635 B2 *   7/2009   Fujii .................... H01L 23/544
                                                        438/462
8,728,914 B2 *   5/2014   Sakamoto ............. B23K 26/40
                                                        438/462

(Continued)

FOREIGN PATENT DOCUMENTS

CN      104124208 A     10/2014
CN      104508800 A     4/2015
(Continued)

OTHER PUBLICATIONS

International Preliminary Report on Patentability dated Apr. 12, 2018 for PCT/JP2016/073468.

*Primary Examiner* — Dana Ross
*Assistant Examiner* — Kuangyue Chen
(74) *Attorney, Agent, or Firm* — Faegre Drinker Biddle & Reath LLP

(57) ABSTRACT

Provided is a laser processing method including a first step of forming a first modified region along a cutting line by converging laser light on an object having a surface and a back surface with the back surface as an incident surface and moving a first converging point along the cutting line set to pass between an effective region and an ineffective region adjacent to each other while maintaining a distance between a surface and the first converging point at a first distance, and a second step of forming a second modified region along the cutting line by converging the laser light on the object with the back surface as the incident surface and moving a second converging point along the cutting line while maintaining a (Continued)

distance between the surface and the second converging point at a second distance larger than the first distance.

3 Claims, 29 Drawing Sheets

(51) Int. Cl.
*B23K 26/00* (2014.01)
*B23K 26/38* (2014.01)
*B23K 26/08* (2014.01)
*B23K 26/0622* (2014.01)
*H01L 21/78* (2006.01)
*B23K 103/00* (2006.01)

(52) U.S. Cl.
CPC ........ *B23K 26/048* (2013.01); *B23K 26/0622* (2015.10); *B23K 26/08* (2013.01); *B23K 26/38* (2013.01); *H01L 21/78* (2013.01); *B23K 2103/56* (2018.08)

(58) Field of Classification Search
CPC ............... B23K 26/0622; B23K 26/38; B23K 26/0006; H01L 21/78
USPC ................................... 219/121.72
See application file for complete search history.

(56) References Cited

U.S. PATENT DOCUMENTS

| | | | |
|---|---|---|---|
| 8,871,540 B2* | 10/2014 | Sato | B23K 26/0853 |
| | | | 438/33 |
| 9,130,031 B2* | 9/2015 | Endo | B23K 26/40 |
| 9,368,674 B2* | 6/2016 | Wu | H01L 21/78 |
| 9,478,696 B2* | 10/2016 | Tajikara | H01L 33/0066 |
| 2011/0300691 A1* | 12/2011 | Sakamoto | B23K 26/40 |
| | | | 438/462 |
| 2013/0029444 A1* | 1/2013 | Sato | B23K 26/0853 |
| | | | 438/33 |
| 2015/0060888 A1* | 3/2015 | Wu | H01L 33/24 |
| | | | 257/79 |

FOREIGN PATENT DOCUMENTS

| | | |
|---|---|---|
| JP | 2008-147412 A | 6/2008 |
| JP | 2009-124077 A | 6/2009 |
| JP | 2013-48207 A | 3/2013 |
| JP | 2013-089714 A | 5/2013 |
| JP | 2013-128088 A | 6/2013 |
| JP | 2014-041925 A | 3/2014 |
| JP | 2014-87806 A | 5/2014 |
| JP | 2015-130470 A | 7/2015 |
| JP | 2015-216140 A | 12/2015 |
| JP | 2016-054207 A | 4/2016 |
| WO | WO-03/077295 A1 | 9/2003 |
| WO | WO-2014030519 A1 * | 2/2014 ......... H01L 33/0075 |

* cited by examiner

Fig.7
(a)
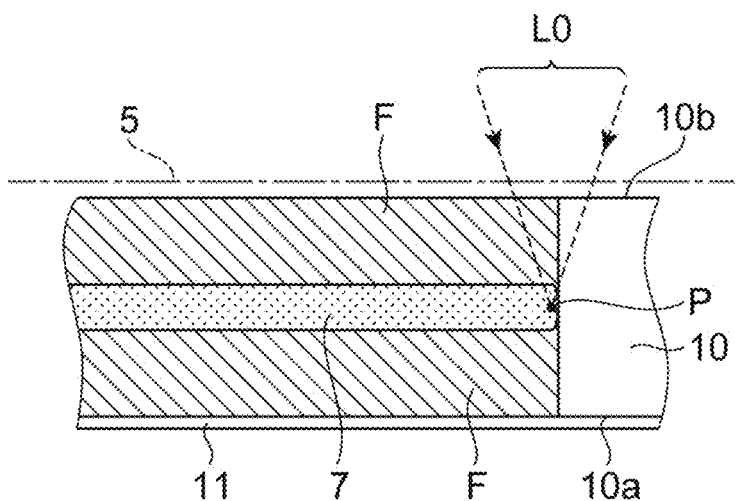
(b)
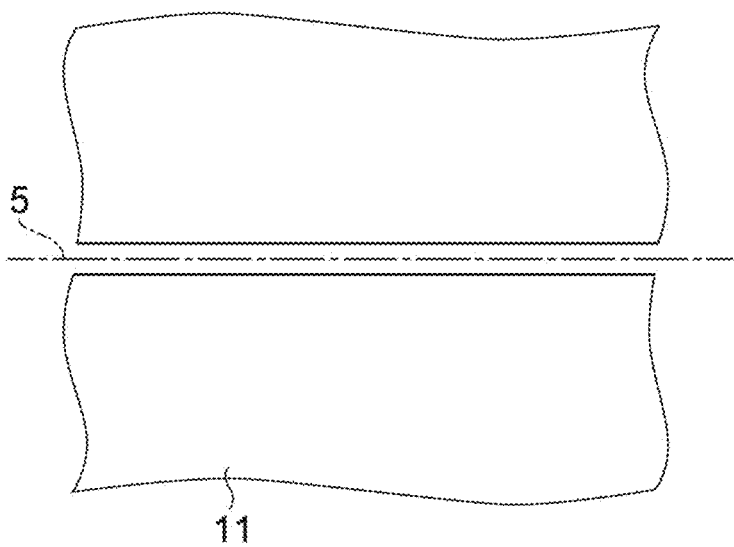

*Fig.8*
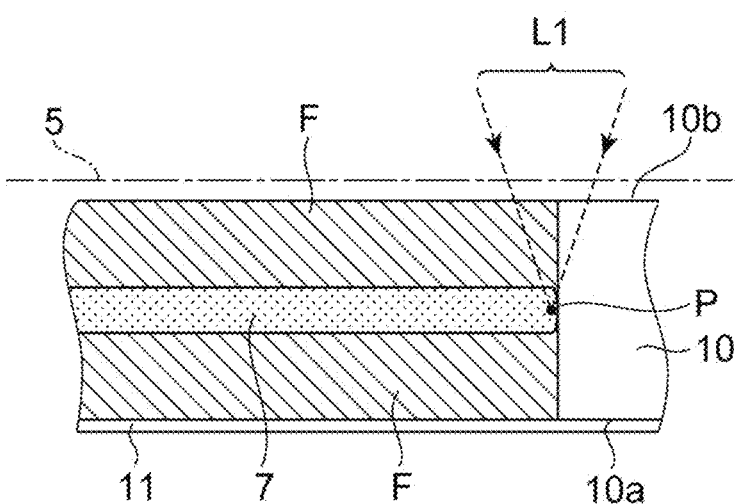
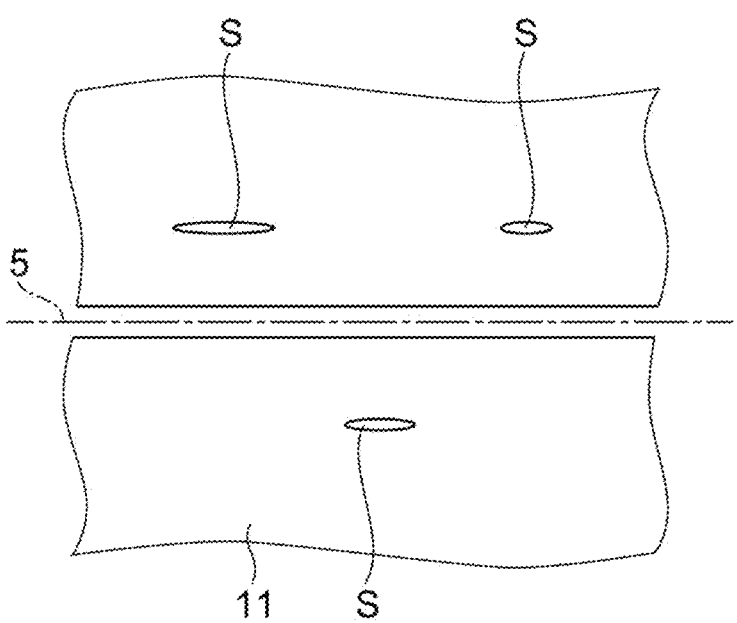

Fig.9
(a)
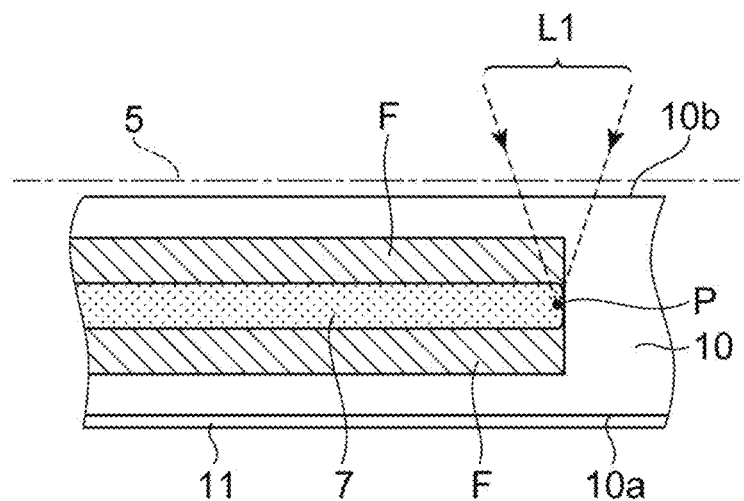
(b)
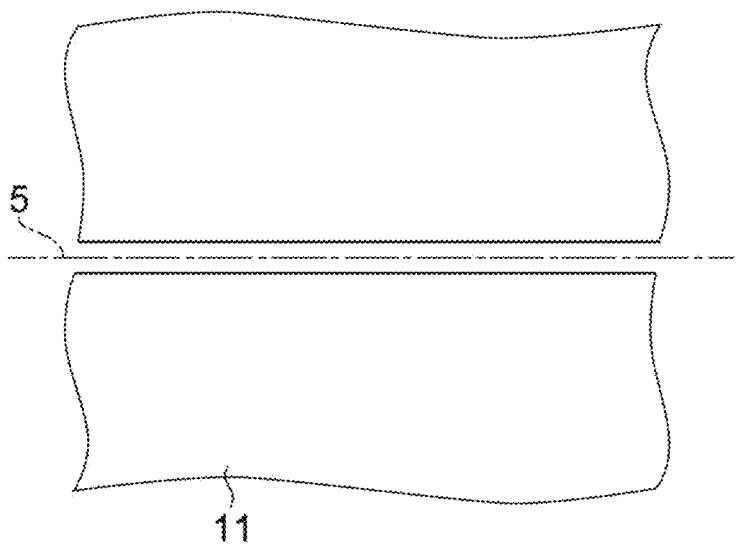

*Fig.11*
(a)
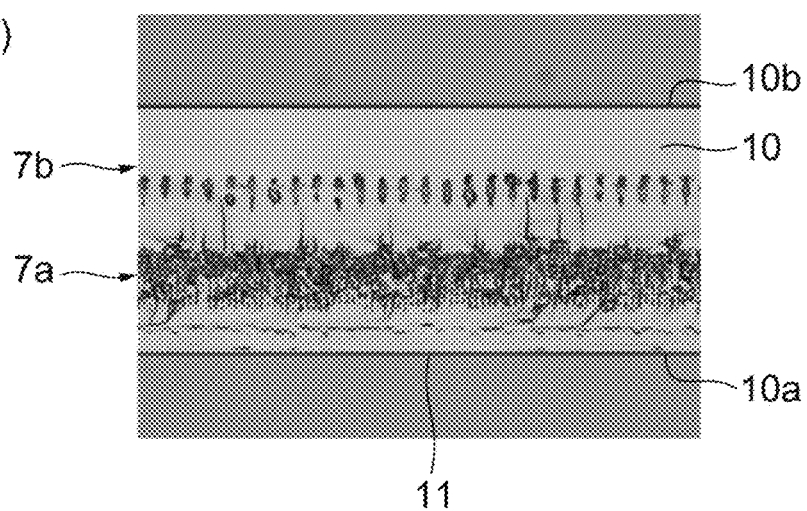
(b)
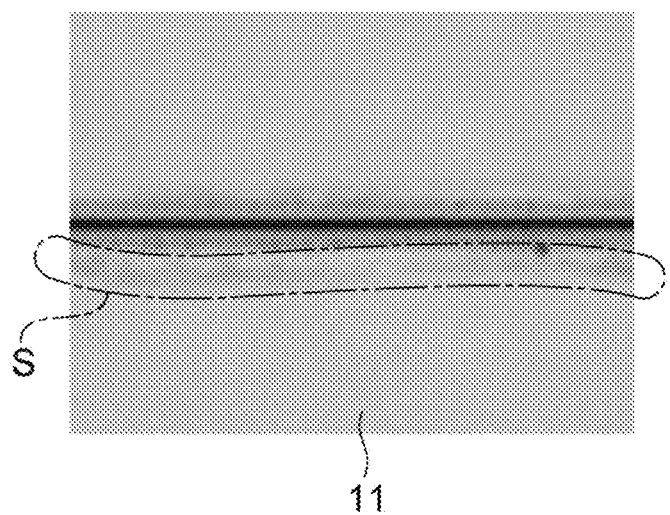

Fig.21
(a)
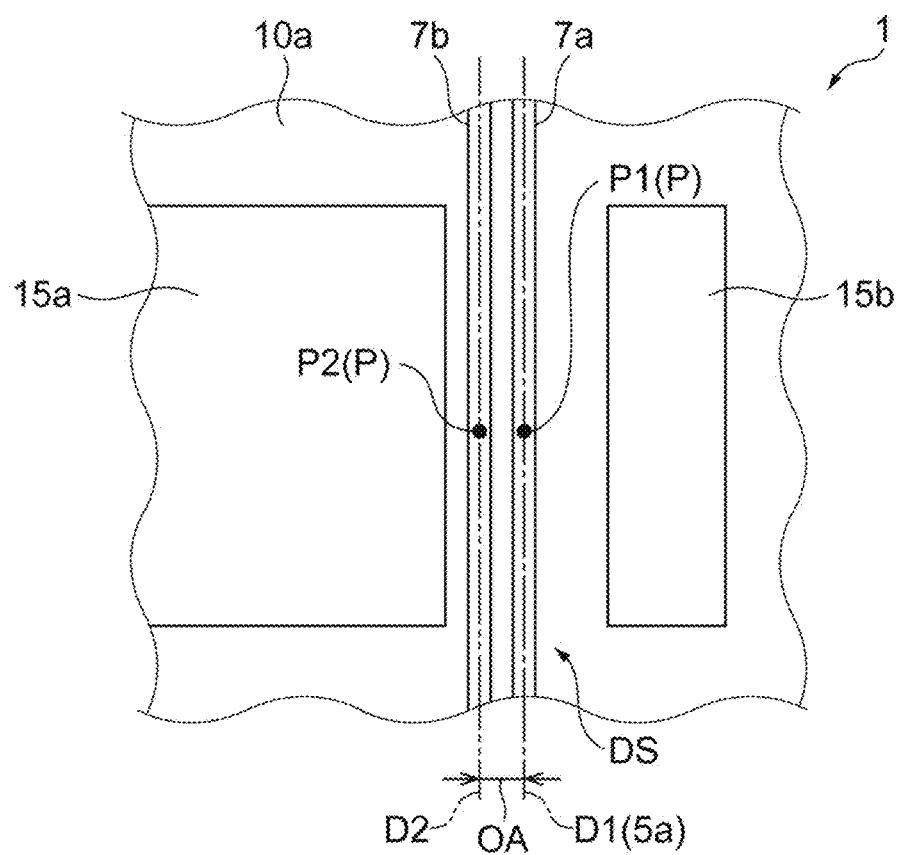
(b)
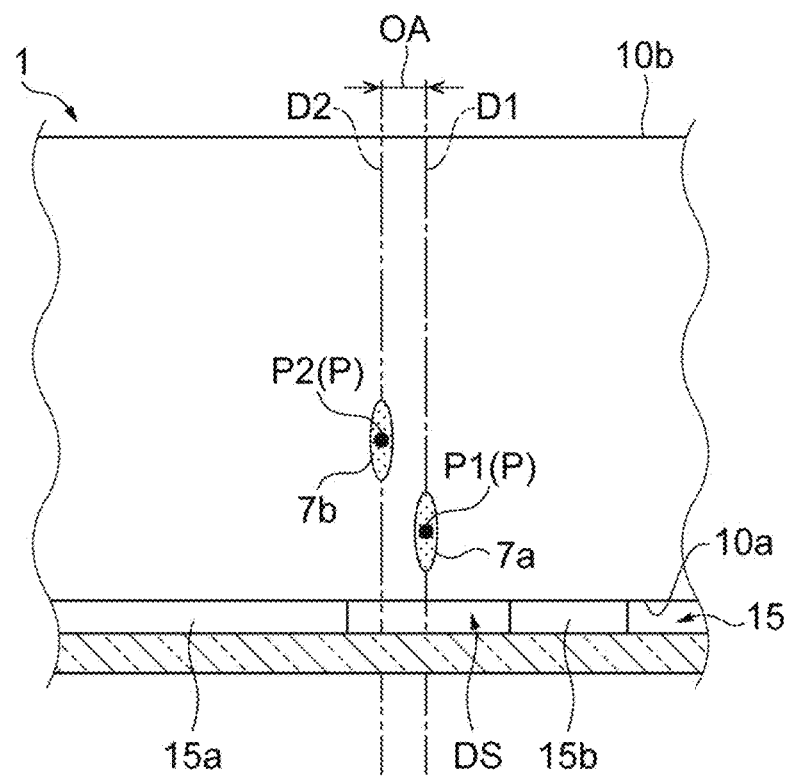

LASER PROCESSING METHOD, AND LASER PROCESSING DEVICE

TECHNICAL FIELD

One aspect of the present invention relates to a laser processing method and a laser processing device.

BACKGROUND ART

There is known a laser processing method in which a modified region is formed in the vicinity of a surface of a silicon substrate along a cutting line, which is set in a grid pattern to pass between adjacent functional elements, by irradiating laser light to an object to be processed including the silicon substrate having a plurality of functional elements formed in a matrix on a surface thereof with a back surface of the silicon substrate as a laser light incident surface and then the object to be processed is cut for each of the functional elements by polishing the back surface of the silicon substrate so that the silicon substrate has a predetermined thickness (for example, refer to Patent Literature 1).

CITATION LIST

Patent Literature

[Patent Literature 1] International Unexamined Patent Publication No. 03/077295

SUMMARY OF INVENTION

Technical Problem

In the laser processing method as described above, it is important from the viewpoint of improving processing efficiency to reduce the number of times of scanning the laser light with respect to one cutting line (that is, the number of rows of the modified region with respect to one cutting line). Therefore, as the modified region is formed, cracks may greatly extend from the modified region in a thickness direction of the silicon substrate by converging the laser light having high transmittance with respect to silicon on the silicon substrate. However, when the laser light having high transmittance with respect to silicon is converged on the silicon substrate, damage may occur to a surface of the silicon substrate on the side opposite to the laser light incident surface, and characteristics of the functional element may deteriorate.

However, as an object to be processed, there is a workpiece including the silicon substrate as described above, an effective region including a functional element formed on the silicon substrate, and an ineffective region formed on the silicon substrate. The effective region is a region which becomes a chip including the functional element by cutting the object to be processed, and the ineffective region is a region which is unnecessary due to the cutting of the object to be processed. In processing such an object to be processed, in particular, in the effective region, it is important to minimize the occurrence of damage on the surface of the silicon substrate and to minimize the deterioration of the characteristics of the functional element.

An aspect of the present invention is to provide a laser processing method and a laser processing device capable of minimizing deterioration of characteristics of a functional element.

Solution to Problem

A laser processing method according to one aspect of the present invention includes a first step of forming a first modified region along a cutting line by converging laser light on an object to be processed including a semiconductor substrate having a surface and a back surface, a plurality of effective regions formed on the surface, and an ineffective region formed on the surface between the effective regions while using the back surface as an incident surface, and moving a first converging point along the cutting line set to pass between the effective region and the ineffective region adjacent to each other while maintaining a distance between the surface and the first converging point of the laser light at a first distance, and a second step of forming a second modified region along the cutting line after the first step by converging the laser light on the object to be processed while using the back surface as the incident surface and moving a second converging point of the laser light along the cutting line while maintaining a distance between the surface and the second converging point at a second distance larger than the first distance, wherein the effective region includes a functional element, and in the second step, the second converging point is moved along the cutting line while the second converging point is offset toward an effective region side of a position at which the first converging point is aligned with respect to a direction perpendicular to both a thickness direction of the semiconductor substrate and an extension direction of the cutting line.

According to the laser processing method, in the second step, the second converging point of the laser light is offset in the direction perpendicular to both the thickness direction of the semiconductor substrate and the extension direction of the cutting line with respect to the position in which the first converging point of the laser light is aligned. Therefore, it is possible to suppress occurrence of damage on the surface of the object to be processed which is opposite to the incident surface of the laser light. Particularly, in the second step, the second converging point is offset toward the effective region side of the position in which the first converging point is aligned. Therefore, it is possible to shift a position in which damage to the surface of the object to be processed may occur to an ineffective region side. That is, it is possible to control the position at which the damage may occur to the ineffective region side rather than the effective region including the functional element. From the above viewpoint, according to this laser processing method, deterioration of characteristics of the functional element can be suppressed.

In the laser processing method according to one aspect of the present invention, the semiconductor substrate may be a silicon substrate, and the laser light may have a wavelength larger than 1064 nm. In this case, as compared with the case of using a laser beam having a wavelength of 1064 nm or less, it is possible to greatly extend a crack from the first modified region and the second modified region in the thickness direction of the semiconductor substrate as the first modified region and the second modified region are formed. Therefore, processing efficiency can be improved.

In the laser processing method according to one aspect of the present invention, the laser light may have a wavelength of 1099 µm or more and 1342 µm or less. In this case, it is possible to more greatly extend the crack from the first modified region and the second modified region in the thickness direction of the semiconductor substrate as the first modified region and the second modified region are formed.

In the laser processing method according to one aspect of the present invention, a distance at which the second converging point is offset in the direction perpendicular to both the thickness direction of the semiconductor substrate and the extension direction of the cutting line with respect to the position at which the first converging point is aligned may be 24 µm or less. In this case, the crack can be securely connected between the first modified region and the second modified region, and thus it is possible to reliably extend the crack from the first modified region and the second modified region in the thickness direction of the semiconductor substrate as the first modified region and the second modified region are formed.

In the laser processing method according to one aspect of the present invention, the distance at which the second converging point is offset in the direction perpendicular to both the thickness direction of the semiconductor substrate and the extension direction of the cutting line with respect to the position at which the first converging point is aligned may be 2 µm or more and 8 µm or less. In this case, an offset distance of the second converging point can be set within a necessary and sufficient range.

In the laser processing method according to one aspect of the present invention, in the first step, the first converging point may be moved along the cutting line while the distance at which the first converging point is offset in the direction perpendicular to both the thickness direction of the semiconductor substrate and the extension direction of the cutting line is maintained to be 0 with respect to the cutting line. In this case, the crack extending from the first modified region to the surface side of the semiconductor substrate can be aligned on the cutting line.

A laser processing device according to one aspect of the present invention includes a support base configured to support an object to be processed including a semiconductor substrate having a surface and a back surface, a plurality of effective regions formed on the surface, and an ineffective region formed on the surface between the effective regions, a laser light source configured to emit laser light, a converging optical system configured to converge the laser light emitted from the laser light source on the object to be processed supported by the support base so that the back surface becomes an incident surface, and a control unit configured to control an operation of at least one of the support base, the laser light source and the converging optical system, wherein the effective region comprises a functional element, and the control unit moves a first converging point along a cutting line set to pass between the effective region and the ineffective region adjacent to each other while maintaining a distance between the surface and the first converging point of the laser light at a first distance and then moves a second converging point of the laser light along the cutting line while maintaining a distance between the surface and the second converging point at a second distance larger than the first distance and also offsetting the second converging point toward the effective region side of a position at which the first converging point is aligned with respect to a direction perpendicular to both a thickness direction of the semiconductor substrate and an extension direction of the cutting line.

According to the laser processing device, for the same reason as the laser processing method described above, it is possible to suppress the occurrence of the damage on the surface of the object to be processed on the side opposite to the incident surface of the laser light and to control the position in which the damage may occur to the ineffective region side rather than the effective region including the functional element. Therefore, the deterioration of the characteristics of the functional element can be minimized.

Advantageous Effects of Invention

According to one aspect of the present invention, it is possible to provide a laser processing method and a laser processing device capable of minimizing deterioration of characteristics of a functional element.

BRIEF DESCRIPTION OF DRAWINGS

FIG. 7($a$) is a cross-sectional view of the object to be processed along a cutting line during laser processing. FIG. 7($b$) is a plan view of the object to be processed after cutting.

FIG. 8($a$) is a cross-sectional view of the object to be processed along the cutting line during laser processing. FIG. 8($b$) is a plan view of the object to be processed after cutting.

FIG. 9($a$) is a cross-sectional view of the object to be processed along the cutting line during laser processing. FIG. 9($b$) is a plan view of the object to be processed after cutting.

FIG. 10($b$) is a plan view of the object to be processed after cutting.

FIG. 11($a$) is a diagram illustrating a photograph of a surface of a silicon substrate parallel to the cutting line after cutting. FIG. 11($b$) is a diagram illustrating a photograph of a surface side of the silicon substrate after cutting.

FIG. 12($b$) is a diagram illustrating a photograph of the surface of the silicon substrate perpendicular to the cutting line after the formation of the first modified region and the second modified region.

FIG. 13($b$) is a diagram illustrating a photograph of the surface of the silicon substrate perpendicular to the cutting line after the formation of the first modified region and the second modified region.

FIG. 16($b$) is a diagram illustrating a photograph of the surface side of the silicon substrate after cutting.

FIG. 17($b$) is a diagram illustrating a photograph of the surface side of the silicon substrate after cutting when the offset amount is 4 µm. FIG. 17($c$) is a diagram illustrating a photograph of the surface side of the silicon substrate after cutting when the offset amount is 6 μm.

FIG. 21 is a cross-sectional view illustrating the method of manufacturing the semiconductor chip using the laser processing method of the embodiment.

DESCRIPTION OF EMBODIMENTS

Figure 1:
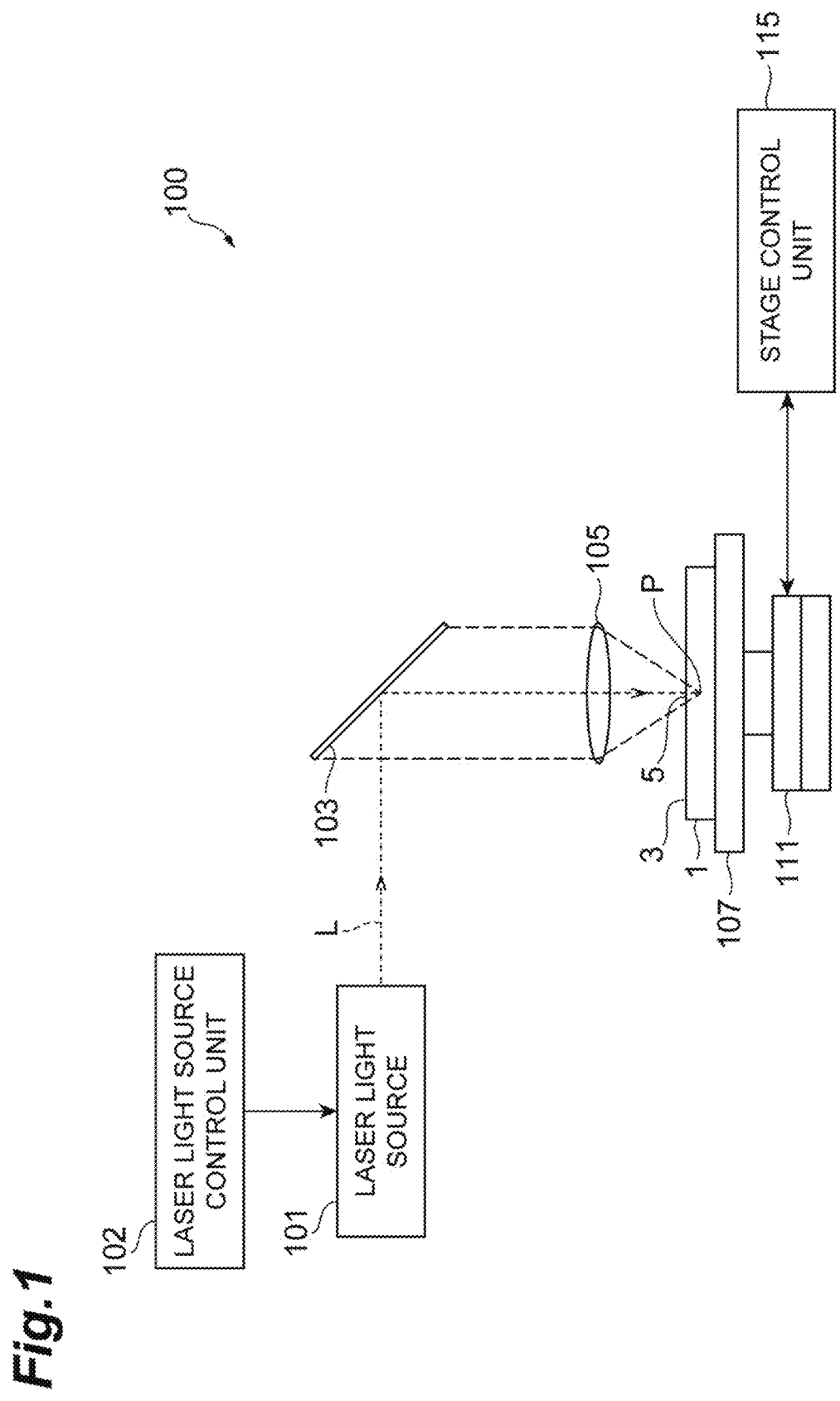
FIG. 1 is a schematic configuration diagram of a laser processing device used for forming a modified region.

Hereinafter, an embodiment of one aspect of the present invention will be described in detail with reference to the drawings. Further, in each of the drawings, the same or corresponding parts are designated by the same reference numerals, and repeated description is omitted.

In a laser processing method and a laser processing device according to the embodiment, a modified region is formed in an object to be processed along a cutting line by converging laser light on the object to be processed. Therefore, first, formation of the modified region will be described with reference to FIGS. 1 to 6.

As illustrated in FIG. 1, a laser processing device 100 includes a laser light source 101 which pulse-oscillates the laser light L, a dichroic mirror 103 which is disposed to change a direction of an optical axis (optical path) of the laser light L by 90°, and a converging lens 105 which converges the laser light L. Further, the laser processing device 100 includes a support base 107 which supports the object 1 to be processed on which the laser light L converged by the converging lens 105 is irradiated, a stage 111 which moves the support base 107, a laser light source control unit 102 which controls the laser light source 101 to adjust an output, a pulse width, a pulse waveform, or the like of the laser light L, and a stage control unit 115 which controls movement of the stage 111.

In the laser processing device 100, the direction of the optical axis of the laser light L emitted from the laser light source 101 is changed by 90° by the dichroic mirror 103, and the laser light L is converged by the converging lens 105 to an inside of the object 1 to be processed which is placed on the support base 107. At the same time, the stage 111 is moved, and the object 1 to be processed is moved relative to the laser light L along the cutting line 5. Therefore, the modified region along the cutting line 5 is formed in the object 1 to be processed. Further, here, although the stage 111 is moved to move the laser light L relatively, the converging lens 105 may be moved, or both of them may be moved.

Figure 2:
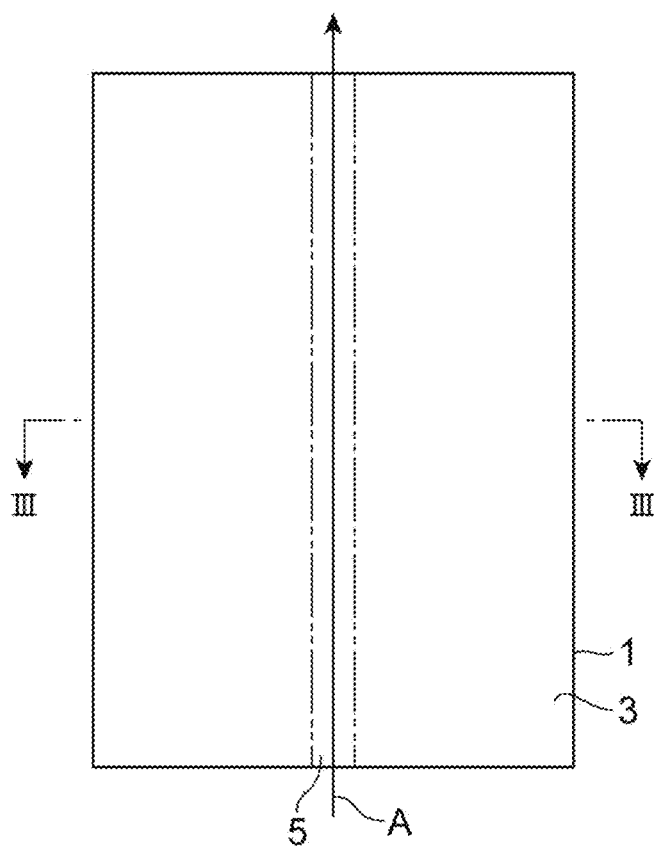
FIG. 2 is a plan view of an object to be processed in which the modified region is formed.
Figure 3:
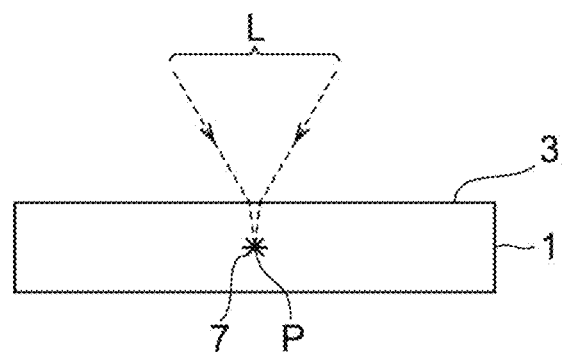
FIG. 3 is a cross-sectional view taken along line III-III of the object to be processed in FIG. 2.
Figure 4:
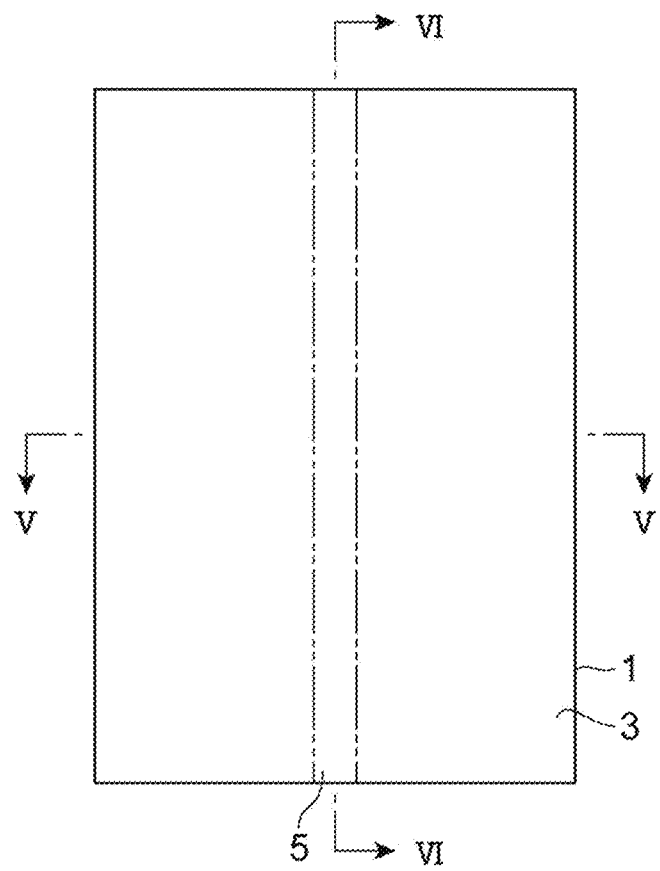
FIG. 4 is a plan view of the object to be processed after laser processing.
Figure 5:
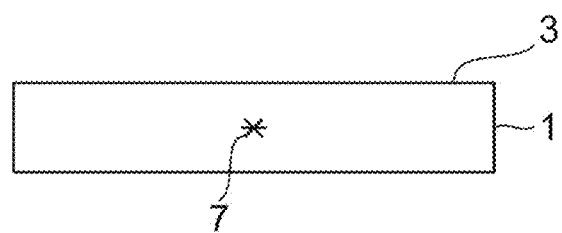
FIG. 5 is a cross-sectional view taken along line V-V of the object to be processed of FIG. 4.
Figure 6:
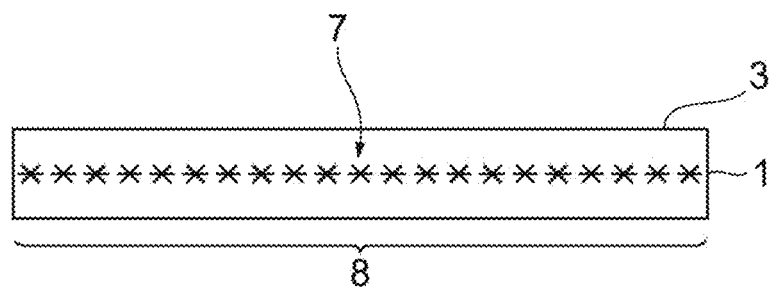
FIG. 6 is a cross-sectional view taken along line VI-VI of the object to be processed in FIG. 4.

A plate-shaped member (for example, a substrate, a wafer, or the like) including a semiconductor substrate formed of a semiconductor material or a piezoelectric substrate formed of a piezoelectric material or the like is used as the object 1 to be processed. As illustrated in FIG. 2, the cutting line 5 for cutting the object 1 to be processed is set in the object 1 to be processed. The cutting line 5 is an imaginary line which extends linearly. When the modified region is formed inside the object 1 to be processed, as illustrated in FIG. 3, the laser light L is relatively moved along the cutting line 5 (that is, in a direction of an arrow A in FIG. 2) in a state in which a converging point (converging position) P is set inside the object 1 to be processed. Therefore, as illustrated in FIGS. 3, 5 and 6, the modified region 7 is formed on the object 1 to be processed along the cutting line 5, and the modified region 7 formed along the cutting line 5 becomes a cutting starting point region 8.

The converging point P is a point on which the laser light L is converged. The cutting line 5 is not limited to a straight line but may be a curved line or a three-dimensional shape obtained by combining these lines or may be designated by coordinates. The cutting line 5 is not limited to the imaginary line but may be a line actually drawn on a surface 3 of the object 1 to be processed. The modified region 7 may be continuously formed or may be formed intermittently. The modified region 7 may be in the form of a row or a dot, and in essence, the modified region 7 may be formed at least inside the object 1 to be processed. Further, cracks may be formed with the modified region 7 as a starting point, and the cracks and the modified region 7 may be exposed on an outer surface (the surface 3, a back surface, or an outer circumferential surface) of the object 1 to be processed. The laser light incident surface at the time of forming the modified region 7 is not limited to the surface 3 of the object 1 to be processed but may be the back surface of the object 1.

Further, when the modified region 7 is formed inside the object 1 to be processed, the laser light L passes through the object 1 to be processed and is particularly absorbed in the vicinity of the converging point P located inside the object 1 to be processed. Therefore, the modified region 7 is formed inside the object 1 to be processed (that is, internal absorption type laser processing). In this case, since the laser light L is hardly absorbed on the surface 3 of the object 1 to be processed, the surface 3 of the object 1 to be processed is not melted. Meanwhile, when the modified region 7 is formed on the surface 3 of the object 1 to be processed, the laser light L is particularly absorbed in the vicinity of the converging point P located on the surface 3, and it is melted and removed from the surface 3 to form removed portions such as holes and grooves (surface absorption type laser processing).

The modified region 7 is a region in which density, refractive index, mechanical strength or other physical characteristics are different from surroundings. For example, the modified region 7 include a melt-processed region (at least one of a region which is once melted and then re-solidified, a region in a molten state and a region in a state of being re-solidified from the molten state), a crack region, a dielectric breakdown region, a refractive index change region, and so on, and includes also regions in which these are mixed. Further, the modified region 7 includes a region in which density of the modified region 7 in a material of the object 1 to be processed is changed compared with that of a non-modified region, and a region in which lattice defects are formed. When the material of the object 1 to be processed is single crystal silicon, the modified region 7 can also be said to be a high dislocation density region.

The melt-processed region, the refractive index change region, the region in which density of the modified region 7 is changed compared with that of the non-modified region, and the region in which the lattice defects are formed may further include cracks (cracks, micro cracks) in an inside of these regions or an interface between the modified region 7 and the non-modified region. The included cracks may extend over the entire surface of the modified region 7 or may be formed only in a part or in a plurality of portions. The object 1 to be processed includes a substrate formed of a crystal material having a crystal structure. For example, the object 1 to be processed includes a substrate formed of at least one of gallium nitride (GaN), silicon (Si), silicon carbide (SiC), $LiTaO_3$, and sapphire ($Al_2O_3$). In other words, the object 1 to be processed includes, for example, a gallium nitride substrate, a silicon substrate, a SiC substrate, a $LiTaO_3$ substrate, or a sapphire substrate. The crystal material may be either an anisotropic crystal or an isotropic crystal. Further, the object 1 to be processed may include a substrate formed of an amorphous material having an amorphous structure (non-crystalline structure) and may include, for example a glass substrate.

In the embodiment, the modified region 7 can be formed by forming a plurality of modified spots (processing traces) along the cutting line 5. In this case, the plurality of modified spots gather and become the modified region 7. The modified spot is a modified portion formed by a shot of one pulse of the pulse laser light (that is, laser irradiation of one pulse: laser shot). The modified spot include a crack spot, a melt-processed spot or a refractive index change spot, or a mixture of at least one of them, and so on. For the modified spot, a size thereof and a length of the cracks generated may be appropriately controlled in consideration of required cutting accuracy, required flatness of a cut surface, a thickness, type, crystal orientation, of the object 1 to be processed, and so on. Further, in the embodiment, the modified spot may be formed as the modified region 7 along the cutting line 5.

Next, a verification result on splash will be described. Further, "when the laser processing as described above is performed on an object to be processed which includes a semiconductor substrate, damage occurring on a surface of the object to be processed on the side opposite to a laser light incident surface" is referred to as "splash." Further, in the following description, a silicon substrate is exemplified as the semiconductor substrate.

As illustrated in FIGS. 7 to 10, an object to be processed having a metal film 11 formed on a surface 10a of a silicon substrate 10 was prepared. The metal film 11 is configured so that a Cr film having a thickness of 20 μm is formed as a base on the surface 10a of the silicon substrate 10 and an Au film having a thickness of 50 μm is formed on the Cr film As illustrated in FIG. 7(a), the modified region 7 was formed inside the silicon substrate 10 along the cutting line 5 by converging laser light L0 having a wavelength of 1064 nm to an inside of the silicon substrate 10 using a back surface 10b of the silicon substrate 10 as the laser light incident surface and moving the converging point P of the laser light L0 along the cutting line 5. At this time, irradiation conditions of the laser light L0 were adjusted so that a crack F extending from the modified region 7 in a thickness direction of the silicon substrate 10 corresponding to formation of the modified region 7 (that is, the crack F generated accompanying the formation of the modified region 7 even though an external force is not applied to the silicon substrate 10) reached the surface 10a of the silicon substrate 10. In this case, as illustrated in FIG. 7(b), the splash did not occur in the metal film 11.

As illustrated in FIG. 8(a), the modified region 7 was formed inside the silicon substrate 10 along the cutting line 5 by converging laser light L1 having a wavelength of 1342 nm to the inside of the silicon substrate 10 using the back surface 10b of the silicon substrate 10 as the laser light incident surface and moving the converging point P of the laser light L1 along the cutting line 5. At this time, the irradiation conditions of the laser light L1 were adjusted so that the crack F extending from the modified region 7 reached the surface 10a of the silicon substrate 10. Specifically, except that the wavelengths are different, the irradiation conditions of the laser light L1 is set to be the same as the above-described irradiation conditions of the laser light L0. In this case, as illustrated in FIG. 8(b), the splash S occurred in the metal film 11.

As illustrated in FIG. 9(a), the modified region 7 was formed inside the silicon substrate 10 along the cutting line 5 by converging laser light L1 having a wavelength of 1342 nm to the inside of the silicon substrate 10 using the back surface 10b of the silicon substrate 10 as the laser light incident surface and moving the converging point P of the laser light L1 along the cutting line 5. At this time, the irradiation conditions of the laser light L1 were adjusted so that the crack F extending from the modified region 7 did not reach the surface 10a of the silicon substrate 10 but fell within the inside of the silicon substrate 10. Specifically, pulse energy of the laser light L1 was made smaller than in the case of FIG. 8. In this case, as illustrated in FIG. 9(b), the splash did not occur in the metal film 11.

As illustrated in FIG. 10(a), a first modified region 7a and a second modified region 7b were formed inside the silicon substrate 10 along the cutting line 5 by converging laser light L1 having a wavelength of 1342 nm to the inside of the silicon substrate 10 using the back surface 10b of the silicon substrate 10 as the laser light incident surface and moving the converging point P of the laser light L1 along the cutting line 5. At this time, the irradiation conditions of the laser light L1 were adjusted so that the crack F did not reach the surface 10a of the silicon substrate 10 only by forming the first modified region 7a but the crack F reached the surface 10a of the silicon substrate 10 when the second modified region 7b is formed on the back surface 10b side of the silicon substrate 10 with respect to the first modified region 7a. In this case, as illustrated in FIG. 10(b), the splash S occurred in the metal film 11.

Figure 10:
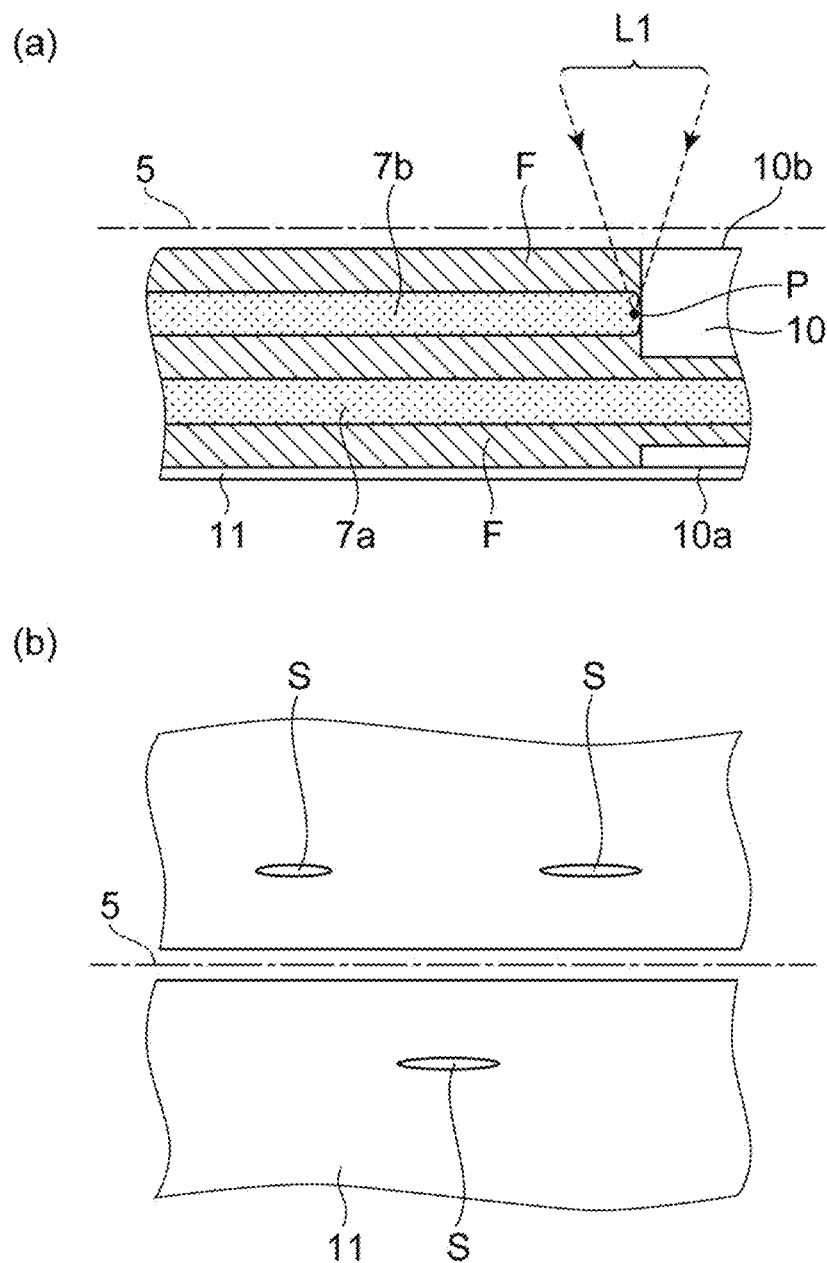
FIG. 10($a$) is a cross-sectional view of the object to be processed along the cutting line during laser processing.

FIG. 11 is a diagram illustrating a photograph of the silicon substrate 10 when the first modified region 7a and the second modified region 7b are formed inside the silicon substrate 10 under the conditions of the case of FIG. 10. More specifically, FIG. 11(a) is a diagram illustrating a photograph of a surface of the silicon substrate 10 parallel to the cutting line after cutting. FIG. 11(b) is a diagram illustrating a photograph of the surface 10a side (metal film 11) of the silicon substrate 10 after cutting. Referring to FIG. 11(b), it can be confirmed that a dark portion is present in a region surrounded by a chain line in the metal film 11. This is the problem splash S.

When the laser light L1 having a wavelength larger than 1064 nm, such as 1342 nm, is used, it is possible to largely extend the crack F from the modified region 7 in the thickness direction of the silicon substrate 10 as compared with the case in which the laser light L0 having a wavelength of 1064 nm or less is used. Further, when the laser light L1 having a wavelength larger than 1064 nm, such as 1342 nm, is used, the modified region 7 may be formed at a position which is deep from the laser light incident surface of the silicon substrate 10 as compared with the case in which the laser light L0 having a wavelength of 1064 nm or less is used. This results from a fact that the laser light L1 having a wavelength larger than 1064 nm has higher transmittance with respect to silicon than the laser light L0 having a wavelength of 1064 nm or less. Therefore, in the viewpoint in which the number of times of scanning the laser light L with respect to one cutting line 5 (that is, the number of rows of the modified region 7 formed with respect to cutting line 5) is reduced to improve processing efficiency, it is preferable to use the laser light L1 having a wavelength larger than 1064 nm.

However, as in the above-described cases of FIGS. 8 and 10, when it is intended to make the crack F reach the surface 10a of the silicon substrate 10 using the laser light L1 having a wavelength larger than 1064 nm, the splash S occurs in the metal film 11. If the splash S occurs when the functional element (for example, a semiconductor operating layer formed by crystal growth, a light receiving element such as a photodiode, a light emitting element such as a laser diode, a circuit element formed as a circuit, or the like) is formed on the surface 10a of the silicon substrate 10 on the side opposite to the laser light incident surface, characteristics of the functional element may be deteriorated.

Therefore, when the crack F is caused to reach the surface 10a of the silicon substrate 10 using the laser light L1 having a wavelength larger than 1064 nm, if it is possible to suppress the occurrence of the splash S, it is technically significant.

The inventors considered the following to be the cause of the occurrence of the splash S on the surface 10a of the silicon substrate 10. When the laser light L1 having a wavelength larger than 1064 nm is used, the laser light L1 is converged on the crack F which has largely extended from the formed modified region 7 and thus influence of leaked light (light of the laser light L1 which passes through to the surface 10a side of the silicon substrate 10 without contributing to the formation of the modified region 7) increases. Based on these findings, the inventors concluded that offsetting the converging point P of the laser light L1 at the time of forming the second modified region 7b in the case of FIG. 10 may reduce the influence of the leaked light which causes the occurrence of the splash S and conducted the following verification. Further, when the second modified region 7b is formed, "offsetting the converging point P of the laser light L1 in a direction perpendicular to both the thickness direction of the silicon substrate 10 and the extension direction of the cutting line 5 (a direction perpendicular to a cross section of the silicon substrate 10 in FIG. 10(a)) with respect to the position at which the converging point P of the laser light L1 is aligned at the time of forming the first modified region 7a" is simply referred to as "offsetting the converging point P of the laser light L1," and "a distance by which the converging point P of the laser light L1 is offset" is referred to as "an offset amount."

Figure 12:
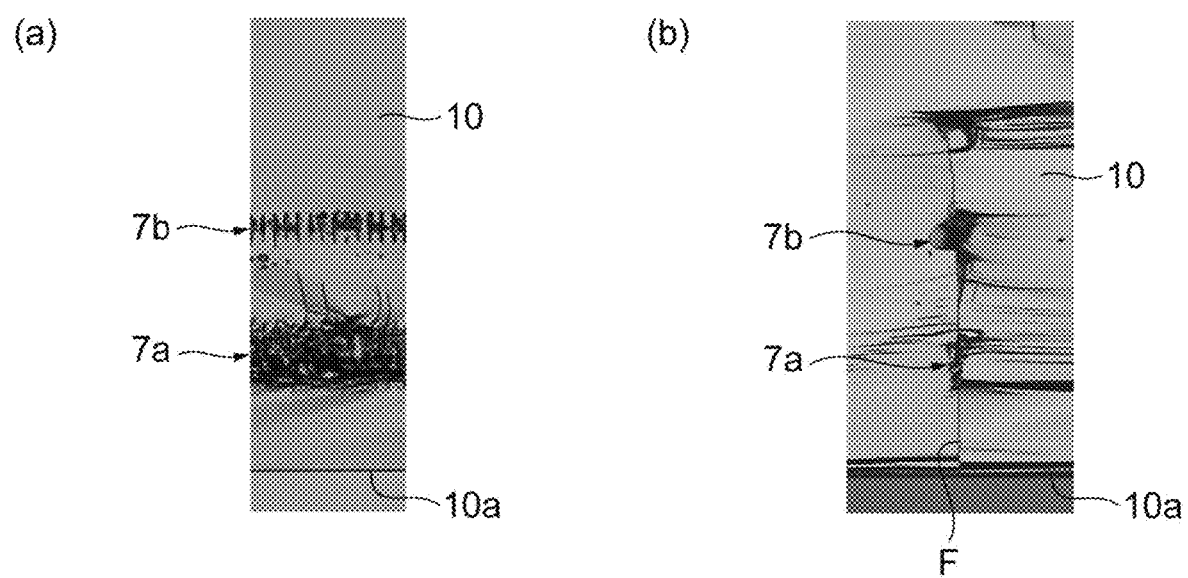
FIG. 12($a$) is a diagram illustrating a photograph of the surface of the silicon substrate parallel to the cutting line after formation of a first modified region and a second modified region.

First, a direction of the crack F extending from the first modified region 7a to the surface 10a side of the silicon substrate 10 was verified. FIG. 12 is a diagram illustrating a photograph of the silicon substrate 10 in the case in which the converging point P of the laser light L1 is not offset when the second modified region 7b is formed. More specifically, FIG. 12(a) is a diagram illustrating a photograph of a surface of the silicon substrate 10 parallel to the cutting line after the first modified region 7a and the second modified region 7b are formed, and FIG. 12(b) is a diagram illustrating a photograph of a surface of the silicon substrate 10 perpendicular to the cutting line after the first modified region 7a and the second modified region 7b are formed. Referring to FIG. 12(b), in the case in which the converging point P of the laser light L1 is not offset when the second modified region 7b is formed, it can be confirmed that the crack F extends straight (in the thickness direction of the silicon substrate 10) from the first modified region 7a to the surface 10a side of the silicon substrate 10.

Figure 13:
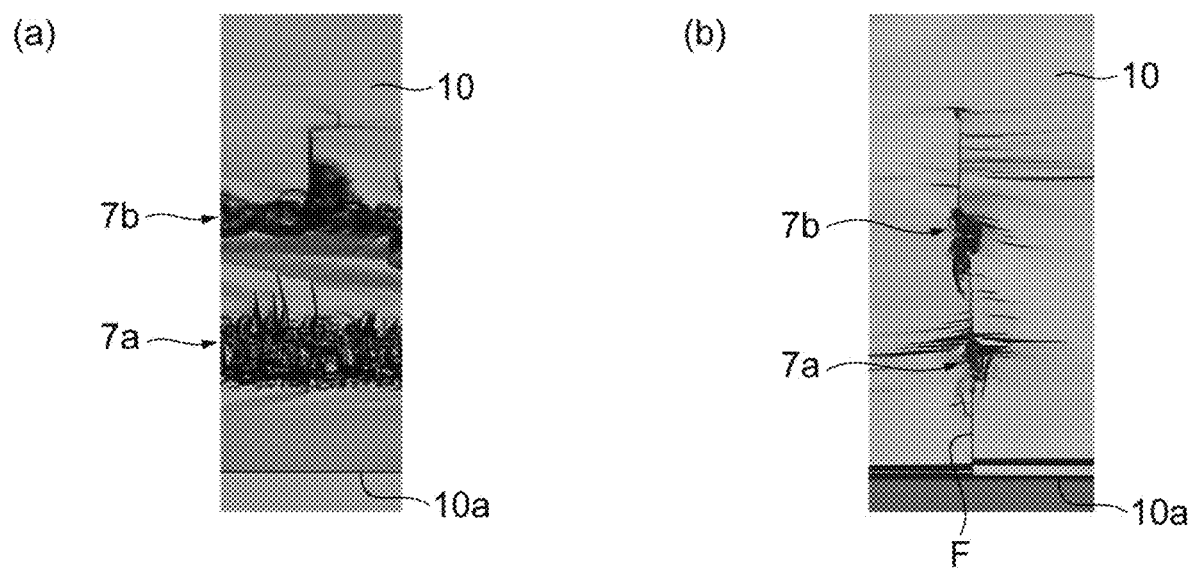
FIG. 13($a$) is a diagram illustrating a photograph of the surface of the silicon substrate parallel to the cutting line after the formation of the first modified region and the second modified region.

FIG. 13 is a diagram illustrating a photograph of the silicon substrate 10 in the case in which the converging point P of the laser light L1 is offset when the second modified region 7b is formed (in the case in which the offset amount is 8 μm). More specifically, FIG. 13(a) is a diagram illustrating a photograph of a surface of the silicon substrate 10 parallel to the cutting line after the first modified region 7a and the second modified region 7b are formed, and FIG. 13(b) is a diagram illustrating a photograph of a surface of the silicon substrate 10 perpendicular to the cutting line after the first modified region 7a and the second modified region 7b are formed. Referring to FIG. 13(b), even in the case in which the converging point P of the laser light L1 is offset when the second modified region 7b is formed, it can be confirmed that the crack F extends straight (in the thickness direction of the silicon substrate 10) from the first modified region 7a to the surface 10a side of the silicon substrate 10.

Figure 14:
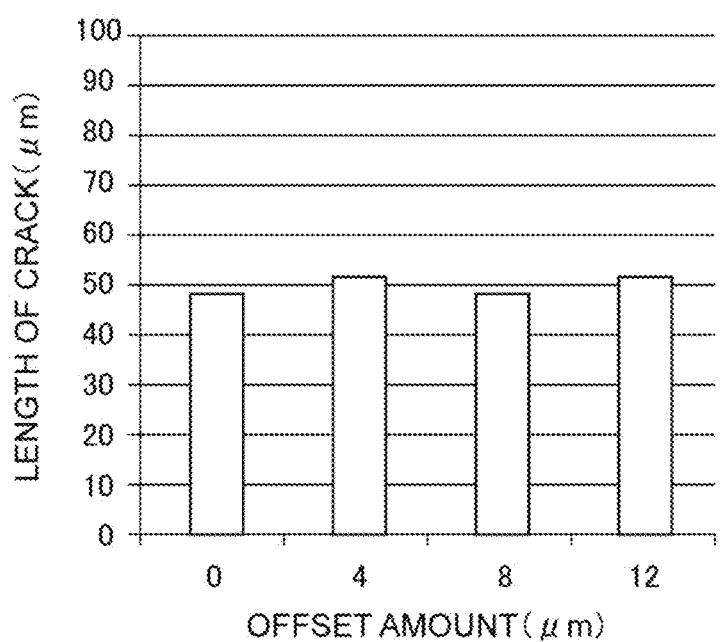
FIG. 14 is a graph illustrating a relationship between an offset amount and a length of a crack.

Subsequently, a length of the crack F extending from the first modified region 7a to the surface 10a side of the silicon substrate 10 was verified. FIG. 14 is a graph illustrating a relationship between the offset amount and the length of the crack F. The length of the crack F is a length of the crack F which extends from the first modified region 7a to the surface 10a side of the silicon substrate 10. Referring to FIG. 14, it can be confirmed that the length of the crack F extending from the first modified region 7a to the surface 10a side of the silicon substrate 10 does not change even in the case in which the converging point P of the laser light L1 is offset or not offset (even when the offset amount is 0 μm) when the second modified region 7b is formed.[0042]

Figure 15:
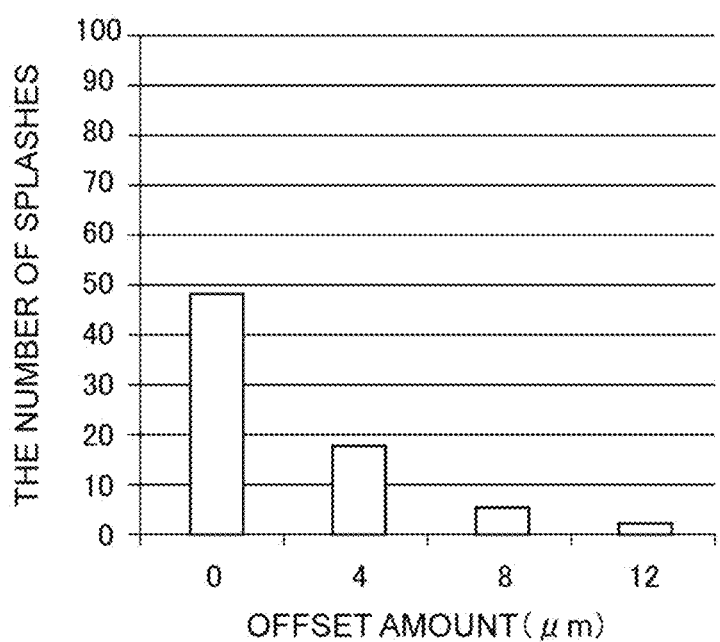
FIG. 15 is a graph illustrating a relationship between the offset amount and the number of splashes.

Subsequently, a generation amount of the splash S was verified. FIG. 15 is a graph illustrating a relationship between the offset amount and the number of splashes S. The number of the splashes S is the number of splashes S (the number per a length of the cutting line 5 of 15 mm) generated in a region which is away from the cutting line 5 to both sides by 20 μm or more. Referring to FIG. 15, it can be confirmed that, in the case in which the converging point P of the laser light L1 is offset when the second modified region 7b is formed, the number of splash S is reduced as compared with the case in which it is not offset (in the case in which the offset amount is 0 µm). Further, the reason why the number of splashes S generated in the region away from the cutting line 5 to both sides by 20 µm or more was counted is because such splashes S causes a problem of degrading the characteristics of the functional element formed on the surface 10a of the silicon substrate 10. Since a dicing street (region between adjacent functional elements) is often provided in a region within 20 µm on both sides of the cutting line 5, it is unlikely that the splash S generated in the region will cause the problem of deteriorating the characteristics of the functional element.

From the verification results of FIGS. 12 to 15, it was found that, even when the converging point P of the laser light L1 is offset at the time of forming the second modified region 7b, the crack F extends straight (in the thickness direction of the silicon substrate 10) from the first modified region 7a to the surface 10a side of the silicon substrate 10 and also the length of the crack F extending from the first modified region 7a to the surface 10a side of the silicon substrate 10 does not change. On the other hand, it was found that, in the case in which the converging point P of the laser light L1 is offset when the second modified region 7b is formed, the number of splashes S decreases. Further, in the verification of FIGS. 12 to 15, the irradiation conditions of the laser light other than the offset amount are the same.

Figure 16:
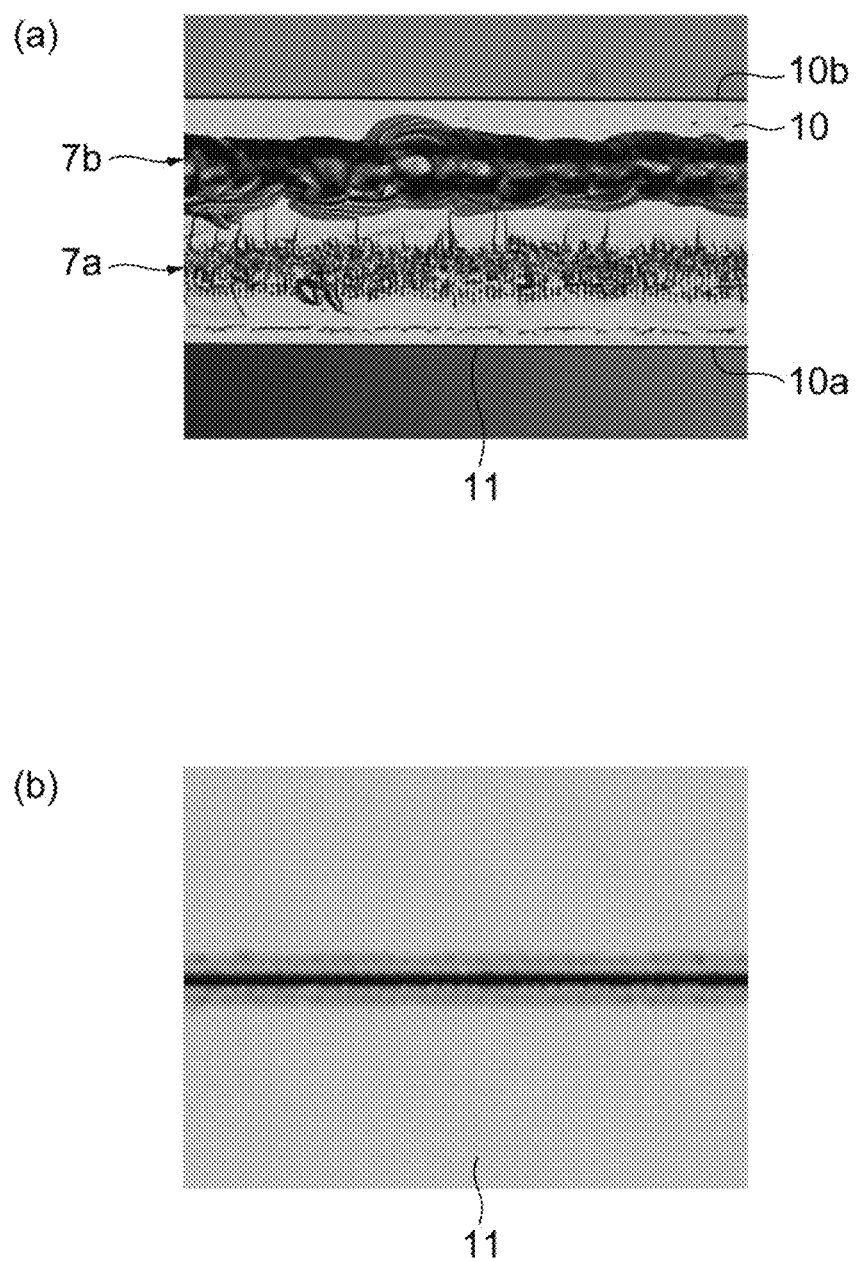
FIG. 16($a$) is a diagram illustrating a photograph of the surface of the silicon substrate parallel to the cutting line after cutting.

The inventors' consideration on the decrease in the number of splashes S is as follows. FIG. 16 is a diagram illustrating a photograph of the silicon substrate 10 in the case in which the converging point P of the laser light L1 is offset when the second modified region 7b is formed. More specifically, FIG. 16(a) is a diagram illustrating a photograph of the surface of the silicon substrate 10 parallel to the cutting line 5 after cutting, and FIG. 16(b) is a diagram illustrating a photograph of the surface 10a side (metal film 11) of the silicon substrate 10 after cutting. Referring to FIG. 16(a), it can be confirmed that the laser light L1 is prevented from being converged on the crack F extending from the completely formed first modified region 7a and second modified region 7b by offsetting the converging point P of the laser light L1 at the time of forming the second modified region 7b and the second modified region 7b is formed to be large. That is, it is considered that the proportion of the laser light L1 which contributes to the formation of the second modified region 7b increases and the proportion of the leaked light decreases. Referring to FIG. 16(b), it can be confirmed that splash S has not occurred.

Meanwhile, referring to FIG. 11(a) illustrating the photograph of the silicon substrate 10 in the case in which the converging point P of the laser light L1 is not offset when the second modified region 7b is formed, it can be confirmed that the second modified region 7b is formed to be small. It is considered that this is caused by a fact that the laser light L1 is converged on the crack F extending from the completely formed first modified region 7a and second modified region 7b and the leaked light is increased. Further, in the verification of FIGS. 11 and 16, the irradiation conditions of laser light other than the offset amount are the same.

Figure 17:
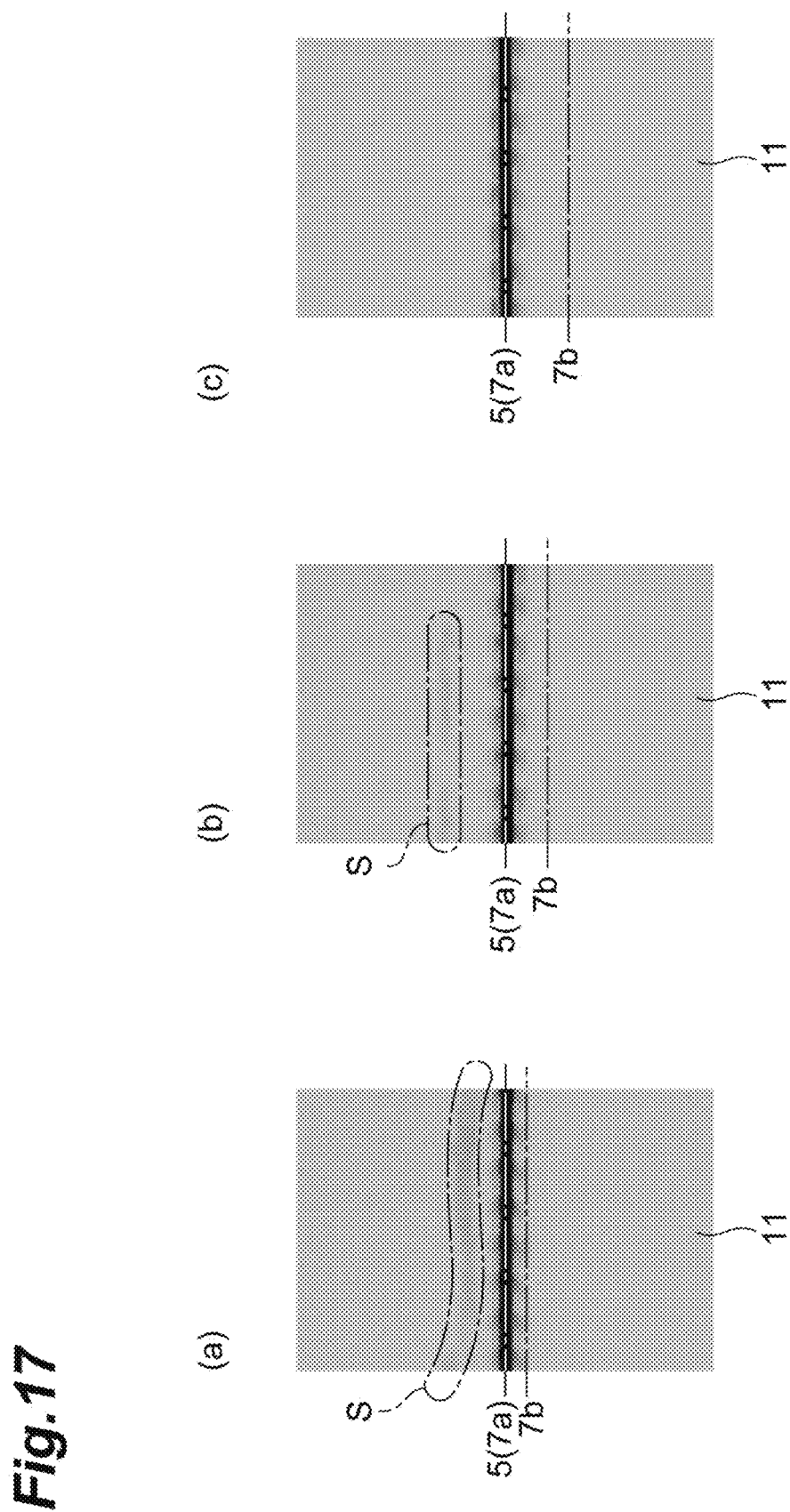
FIG. 17($a$) is a diagram illustrating a photograph of the surface side of the silicon substrate after cutting when the offset amount is 2 µm.

FIG. 17 is a photograph illustrating the surface 10a side (metal film 11) of the silicon substrate 10 after cutting. More specifically, FIG. 17(a) is a diagram in the case in which the offset amount is 2 µm, FIG. 17(b) is a diagram in the case in which the offset amount is 4 µm, and FIG. 17(c) is a diagram in the case in which the offset amount is 6 µm. In each case, the irradiation conditions of laser light other than the offset amount are the same. Referring to FIGS. 17(a) and 17(b), it can be confirmed that, when the second modified region 7b is formed, the splash S occurs on the side opposite to the side at which the converging point P of the laser light L1 is offset and as the offset amount is increased, the splash S is away from the cutting line 5. Further, Referring to FIGS. 17(a), 17(b) and 17(c), it can be confirmed that an occurrence region of the splash S decreases as the offset amount increases. Further, even in the cases of FIGS. 17(a) and 17(b), the region in which the splash S occurs decreases as compared with the case in which the converging point P of the laser light L1 is not offset when the second modified region 7b is formed.

The reason why the results of FIGS. 17(a), 17(b) and 17(c) are obtained are considered as follows. FIG. 18(a) is a diagram illustrating a surface of the silicon substrate 10 perpendicular to the cutting line 5 when the offset amount is small. FIG. 18(b) is a diagram illustrating the surface of the silicon substrate 10 perpendicular to the cutting line 5 when the offset amount is large. Further, "the converging point P of the laser light L1 at the time of forming the first modified region 7a" is referred to as a "first converging point P1," and "the converging point P of the laser light L1 at the time of forming the second modified region 7b" is referred to as a "second converging point P2."

as illustrated in FIG. 18(a), when the offset amount is small, a portion F1 of the crack F extending from the formed first modified region 7a and second modified region 7b, in which the second converging point P2 of the laser light L1 is aligned, is inclined at a small angle with respect to the thickness direction D of the silicon substrate 10. Therefore, an incident angle θ of the laser light L1 with respect to the portion F1 is increased. Accordingly, the leaked light L2 of the laser light L1 which does not contribute to the formation of the second modified region 7b travels at a small angle with respect to the thickness direction D of the silicon substrate 10 toward the side opposite to the side at which the converging point P of the laser light L1 is offset. Therefore, a length of an optical path of the leaked light L2 reaching the surface 10a of the silicon substrate 10 is shortened, and thus an absorption amount and a scattering degree of the leaked light L2 in the silicon substrate 10 are reduced. Further, the terms "small," "large," "short," and so on are used in comparison with the case of FIG. 18(b).

Meanwhile, as illustrated in FIG. 18(b), when the offset amount is large, the portion F1 of the crack F extending from the formed first modified region 7a and second modified region 7b, in which the second converging point P2 of the laser light L1 is aligned, is inclined at a large angle with respect to the thickness direction D of the silicon substrate 10. Therefore, the incident angle θ of the laser light L1 with respect to the portion F1 is reduced. Accordingly, the leaked light L2 of the laser light L1 which does not contribute to the formation of the second modified region 7b travels at a large angle with respect to the thickness direction D of the silicon substrate 10 toward the side opposite to the side at which the converging point P of the laser light L1 is offset. Therefore, the length of the optical path of the leaked light L2 reaching the surface 10a of the silicon substrate 10 becomes longer, and thus the absorption amount and the scattering degree of the leaked light L2 in the silicon substrate 10 are increased. The terms "large," "small," "long" and so on are used in comparison with the case of FIG. 18(a).

Figure 18:
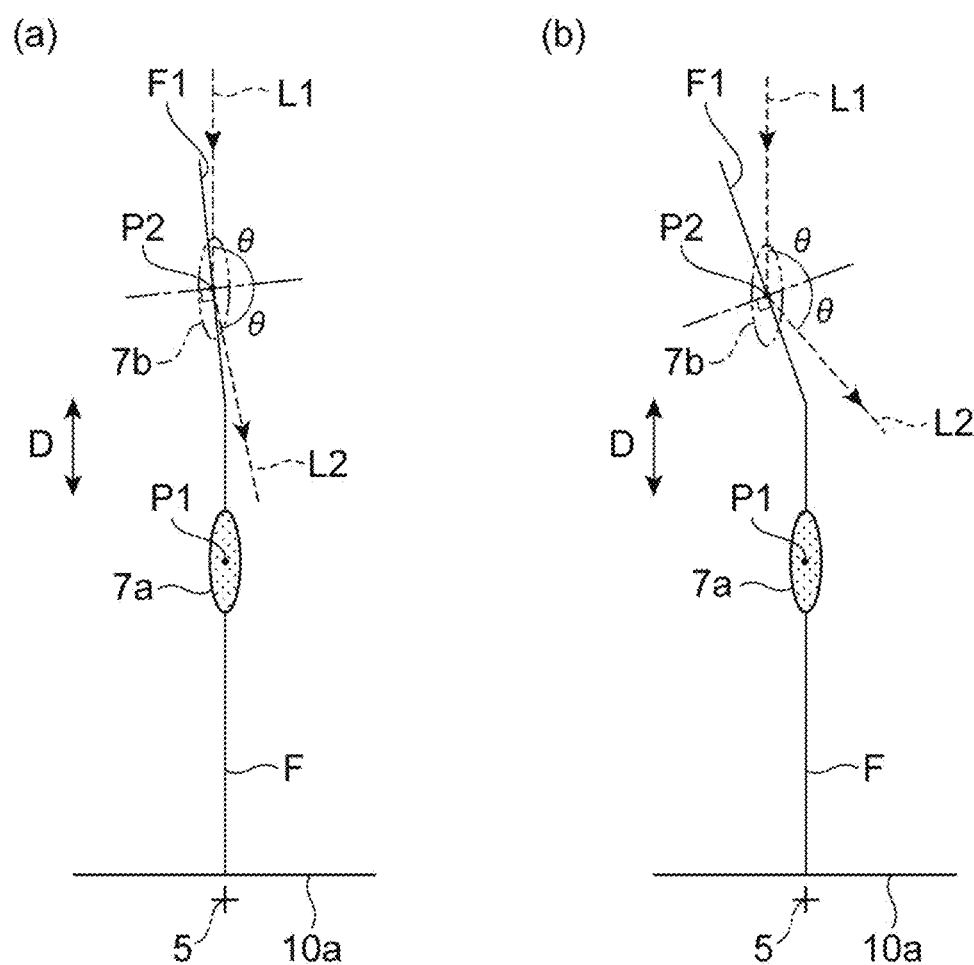
FIG. 18(a) is a diagram illustrating a surface of the silicon substrate perpendicular to the cutting line when the offset amount is small.
FIG. 18(b) is a diagram illustrating the surface of the silicon substrate perpendicular to the cutting line when the offset amount is large.

From the above consideration of FIG. 18, it is considered that the splash S occurs on the side opposite to the side in which the converging point P of the laser light L1 is offset when the second modified region 7b is formed, and as the offset amount increases, the splash S is away from the cutting line 5, and as the offset amount increases, the region in which the splash S occurs decreases.

Figure 19:
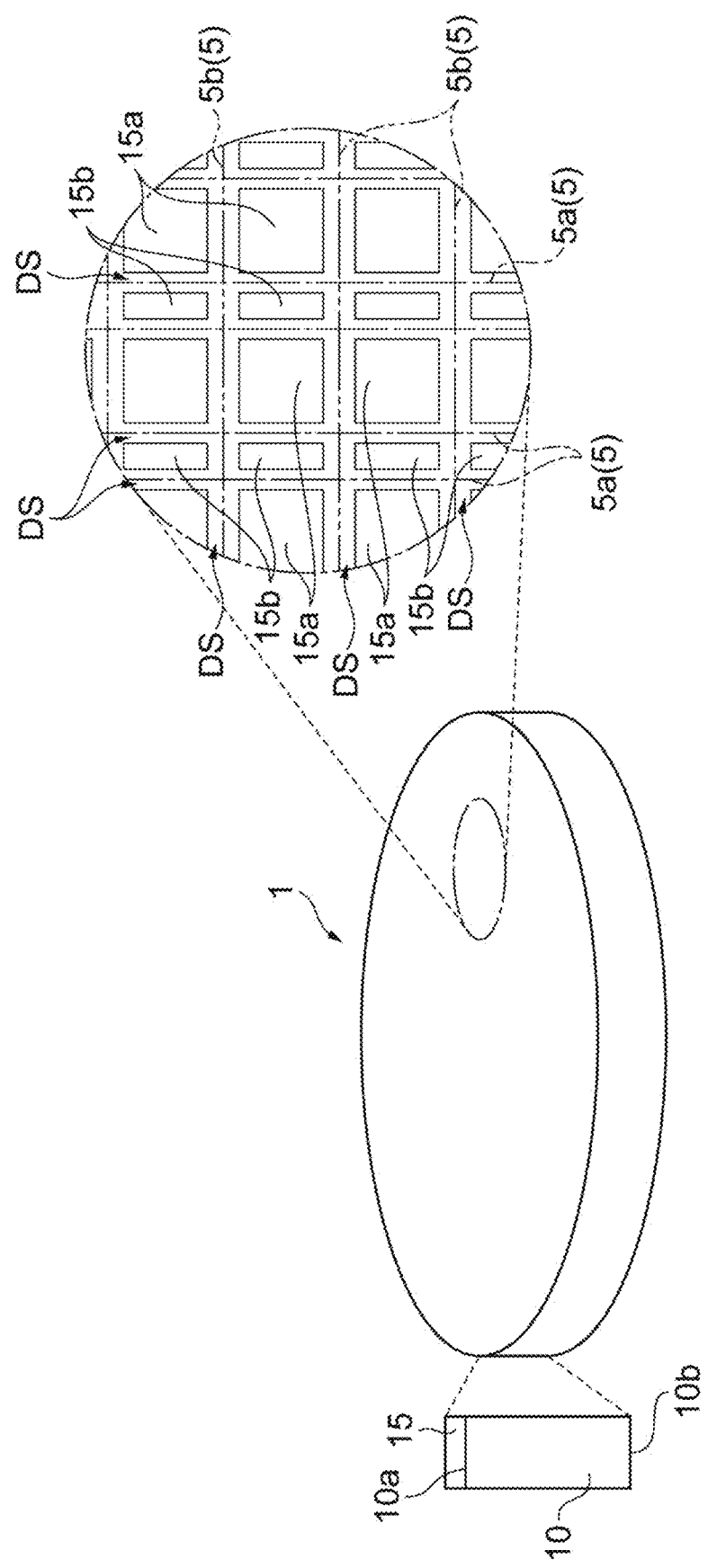
FIG. 19 is a view illustrating the object to be processed in the laser processing method according to the embodiment.

Next, a method of manufacturing a semiconductor chip using the laser processing method of the embodiment will be described. First, as illustrated in FIG. 19, an object 1 to be processed is prepared. The object 1 has a silicon substrate (semiconductor substrate) 10 and a functional element layer 15. The silicon substrate 10 includes a surface 10a and a back surface 10b opposite to the surface 10a. The functional element layer 15 is formed on the surface 10a. The functional element layer 15 includes a plurality of effective regions 15a and a plurality of ineffective regions 15b. Each of the effective regions 15a includes a functional element. Therefore, the effective region 15a is a region which becomes a semiconductor chip including the functional element by cutting the object 1. The ineffective region 15b is a region which is unnecessary (becomes an unnecessary chip) due to cutting of the object 1 to be processed. The ineffective region 15b is, for example, a TEG region.

The effective region 15a is two-dimensionally arranged on the surface 10a in first and second directions. The first direction and the second direction cross each other (orthogonally). The ineffective region 15b is provided between the adjacent effective regions 15a on the surface 10a. Here, the ineffective region 15b is arranged between the adjacent effective regions 15a only in the first direction of the first and second directions. Further, for the first direction, the ineffective region 15b may be further provided outside the effective region 15a located on an end side of the object 1 to be processed.

A dicing street DS extending in the second direction is provided between the effective region 15a and the ineffective region 15b adjacent to each other in the first direction. Further, a dicing street DS extending in the first direction is provided between the effective regions 15a adjacent to each other in the second direction. Here, a cutting line 5a is set in the dicing street DS extending in the second direction. Also, a cutting line 5b is set in the dicing street DS extending in the first direction. Accordingly, here, the cutting lines 5 are set in a grid pattern to pass between the adjacent functional elements.

Figure 20:
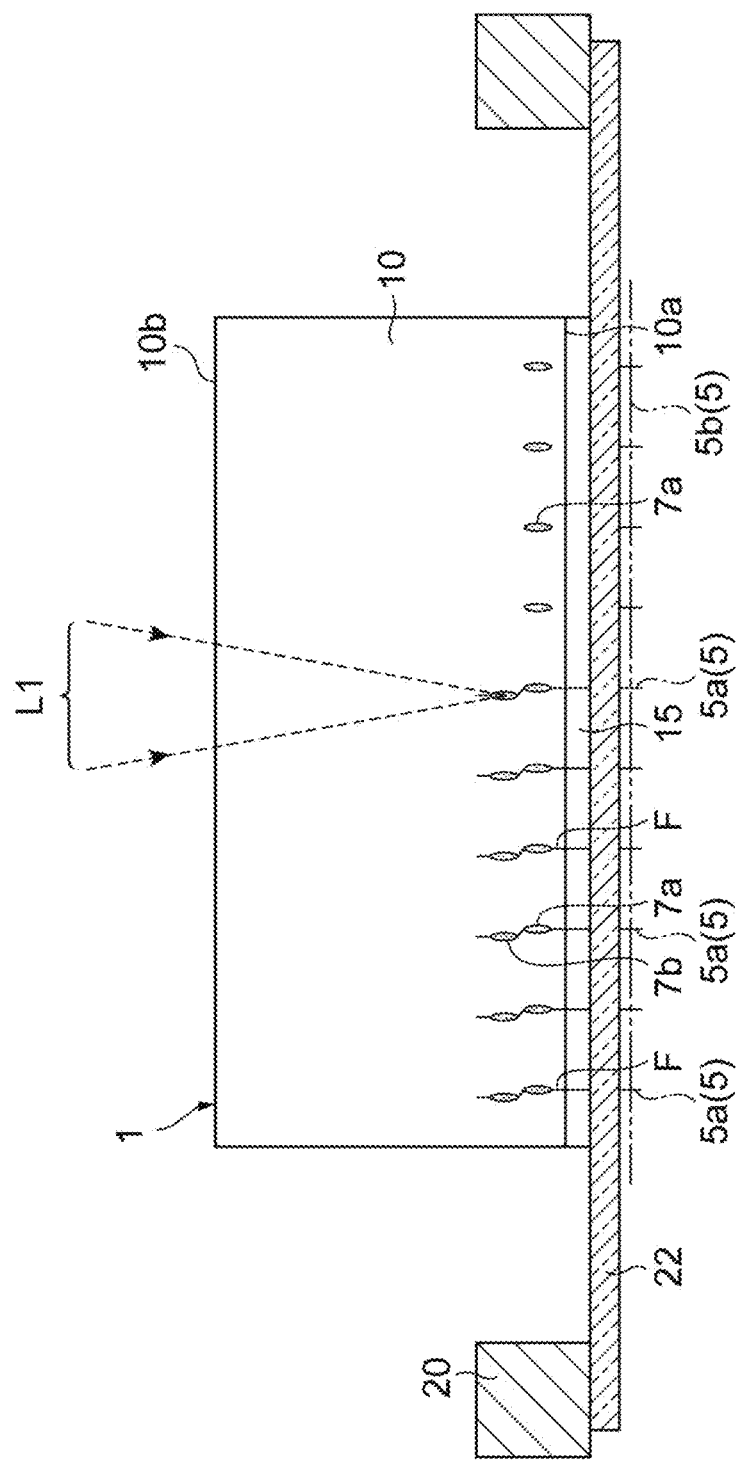
FIG. 20 is a cross-sectional view illustrating a method of manufacturing a semiconductor chip using the laser processing method of the embodiment.

Subsequently, as illustrated in FIG. 20, the functional element layer 15 side of the object 1 to be processed is attached to a protective film 22 held by a ring-shaped holding member 20. Subsequently, the first modified region 7a and the second modified region 7b are formed along each of the cutting lines 5 set in a grid pattern to pass between the adjacent functional elements. This process will be described in more detail.

In this process, as illustrated in FIGS. 20 and 21, first, the first modified region 7a is formed along each of the cutting lines 5a. More specifically, the first modified region 7a is formed along the cutting line 5a by converging the laser light L1 having a wavelength larger than 1064 nm on the silicon substrate 10 while using the back surface 10b of the silicon substrate 10 as the incident surface and moving a first converging point P1 along the cutting line 5a while maintaining a distance between the surface 10a of the silicon substrate 10 and the first converging point P1 of the laser light L at a first distance (first step). At this time, the first converging point P1 is moved along the cutting line 5a while a distance at which the first converging point P1 is offset in the direction perpendicular to both the thickness direction of the silicon substrate 10 and the extension direction of the cutting line 5a is maintained to be 0 with respect to the cutting line 5a. That is, the first converging point P1 of the laser light L is moved along the cutting line 5a while a state in which the first converging point P1 of the laser light L is located on the cutting line 5a when seen from the thickness direction of the silicon substrate 10 is maintained. Therefore, the first modified region 7a is formed inside the silicon substrate 10 along the cutting line 5a while located on the cutting line 5a when seen from the thickness direction of the silicon substrate 10.

Sequentially, the second modified region 7b is followed along each of the cutting lines 5a. More specifically, the second modified region 7b is formed along the cutting line 5a by converging the laser light L1 having a wavelength larger than 1064 nm on the silicon substrate 10 while using the back surface 10b of the silicon substrate 10 as the incident surface and moving a second converging point P2 along the cutting line 5a while maintaining a distance between the surface 10a of the silicon substrate 10 and the second converging point P2 of the laser light L1 at a second distance longer than the first distance and also offsetting the second converging point P2 of the laser light L1 (second step). That is, the second converging point P2 of the laser light L is moved along the cutting line 5a (parallel to the cutting line 5) while a state in which the second converging point P2 of the laser light L is away from the cutting line 5a by a distance when seen from the thickness direction of the silicon substrate 10 is maintained. Therefore, the second modified region 7b is formed inside the silicon substrate 10 along the cutting line 5a (parallel to the cutting line 5a) while being away from the cutting line 5a by the predetermined distance when seen from the thickness direction of the silicon substrate 10.

At this time, an offsetting direction of the second converging point P2 is set as follows. That is, the cutting line 5a is set between the effective region 15a and the ineffective region 15b adjacent to each other. Then, in the second step, the second converging point P2 is offset to the effective region 15a side (that is, the side opposite to the ineffective region 15b) of a position D1 in which the first converging point P1 is aligned with respect to the direction perpendicular to both the thickness direction of the silicon substrate 10 and the extension direction of the cutting line 5a. That is, the second converging point P2 is aligned with a position D2 between the position D1 in which the first converging point P1 is aligned and the effective region 15a. A distance between the position D1 and the position D2 is an offset amount OA. Here, the offset amount OA is, for example, 24 μm or less (also, for example, 2 μm or more and 8 μm or less).

Therefore, the crack F extending from the first modified region 7a and the second modified region 7b in the thickness direction of the silicon substrate 10 reaches the surface 10a of the silicon substrate 10, and the functional element layer 15 is cut along the cutting line 5a for each of the effective regions 15a and the ineffective regions 15b. Further, as an example, a thickness of the silicon substrate 10 is 775 μm, and the first modified region 7a and the second modified region 7b are formed in a region from the surface 10a of the silicon substrate 10 to a depth of 160 μm.

Sequentially, the first modified region 7a is formed along each of the cutting lines 5b. More specifically, the first modified region 7a is formed along the cutting line 5b by converging the laser light L1 having a wavelength larger than 1064 nm on the silicon substrate 10 while using the back surface 10b of the silicon substrate 10 as the incident surface and moving the first converging point P1 along the cutting line 5b while maintaining a distance between the surface 10a of the silicon substrate 10 and the first converging point P1 of the laser light L at a first distance (third process). At this time, the first converging point P1 is moved along the cutting line 5b while a distance at which the first converging point P1 is offset in the direction perpendicular to both the thickness direction of the silicon substrate 10 and the extension direction of the cutting line 5b is maintained to be 0 with respect to the cutting line 5b. That is, the first converging point P1 of the laser light L is moved along the cutting line 5b while a state in which the first converging point P1 of the laser light L is located on the cutting line 5b when seen from the thickness direction of the silicon substrate 10 is maintained. Therefore, the first modified region 7a is formed inside the silicon substrate 10 along the cutting line 5b while located on the cutting line 5b when seen from the thickness direction of the silicon substrate 10.

Sequentially, the second modified region 7b is formed along each of the cutting lines 5b. More specifically, the second modified region 7b is formed along the cutting line 5b by converging the laser light L1 having a wavelength larger than 1064 nm on the silicon substrate 10 while using the back surface 10b of the silicon substrate 10 as the incident surface and moving a second converging point P2 along the cutting line 5b while maintaining a distance between the surface 10a of the silicon substrate 10 and the second converging point P2 of the laser light L1 at a second distance longer than the first distance and also offsetting the second converging point P2 of the laser light L1 (fourth process). That is, the second converging point P2 of the laser light L is moved along the cutting line 5b (parallel to the cutting line 5b) while a state in which the second converging point P2 of the laser light L is away from the cutting line 5b by a predetermined distance when seen from the thickness direction of the silicon substrate 10 is maintained. Therefore, the second modified region 7b is formed inside the silicon substrate 10 along the cutting line 5b (parallel to the cutting line 5b) while being away from the cutting line 5b by the predetermined distance when seen from the thickness direction of the silicon substrate 10.

Therefore, the crack F extending from the first modified region 7a and the second modified region 7b in the thickness direction of the silicon substrate 10 reaches the surface 10a of the silicon substrate 10, and the functional element layer 15 is cut along the cutting line 5b for each of the effective regions 15a.

The above-described first to fourth processes are performed by the laser processing device 100 described above. That is, the support base 107 supports the object 1 to be processed. The laser light source 101 emits the laser light L1 having a wavelength larger than 1064 nm. The converging lens (converging optical system) 105 converges the laser light L1 emitted from the laser light source 101 on the object 1 to be processed which is supported by the support base 107 so that the back surface 10b of the silicon substrate 10 becomes the laser light incident surface. Additionally, the stage control unit (control unit) 115 and the laser light source control unit (control unit) 102 control operations of the support base 107 and the laser light source 101, respectively, so that the above-described first to fourth steps are performed. Further, the movement of the first converging point P1 and the second converging point P2 of the laser light L with respect to the cutting line 5 may be realized by the operation of the converging lens 105 side and may also be realized by both the operations of the support base 107 side and the converging lens 105 side.

Figure 22:
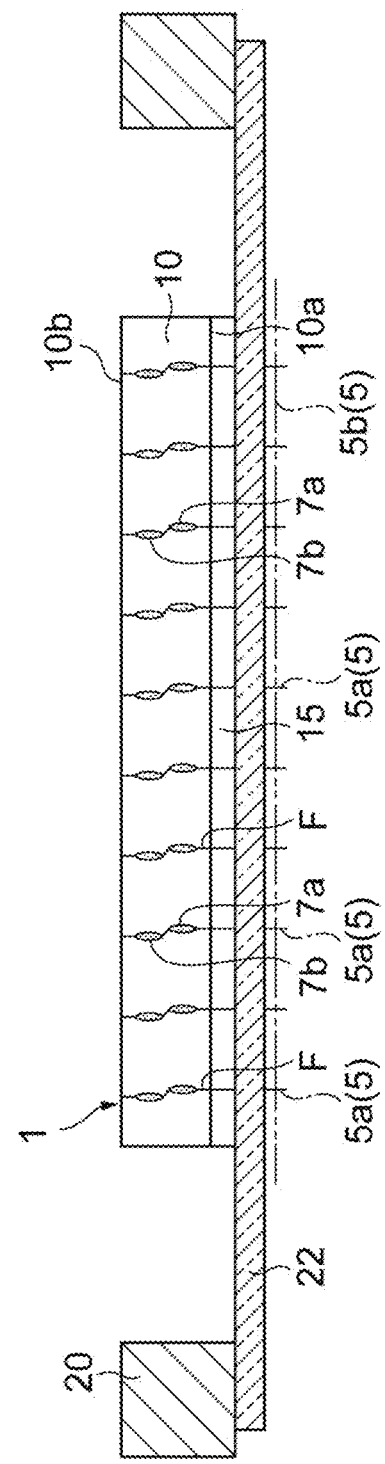
FIG. 22 is a cross-sectional view illustrating the method of manufacturing the semiconductor chip using the laser processing method of the embodiment.

Sequentially, as illustrated in FIG. 22, the object 1 to be processed is thinned to a predetermined thickness by polishing the back surface 10b of the silicon substrate 10. Therefore, the crack F extending from the first modified region 7a and the second modified region 7b in the thickness direction of the silicon substrate 10 reaches the back surface 10b of the silicon substrate 10, and thus the object 1 to be processed is cut for each of the effective regions 15a and the ineffective regions 15b. As an example, the silicon substrate 10 is thinned to a thickness of 200 µm.

Figure 23:
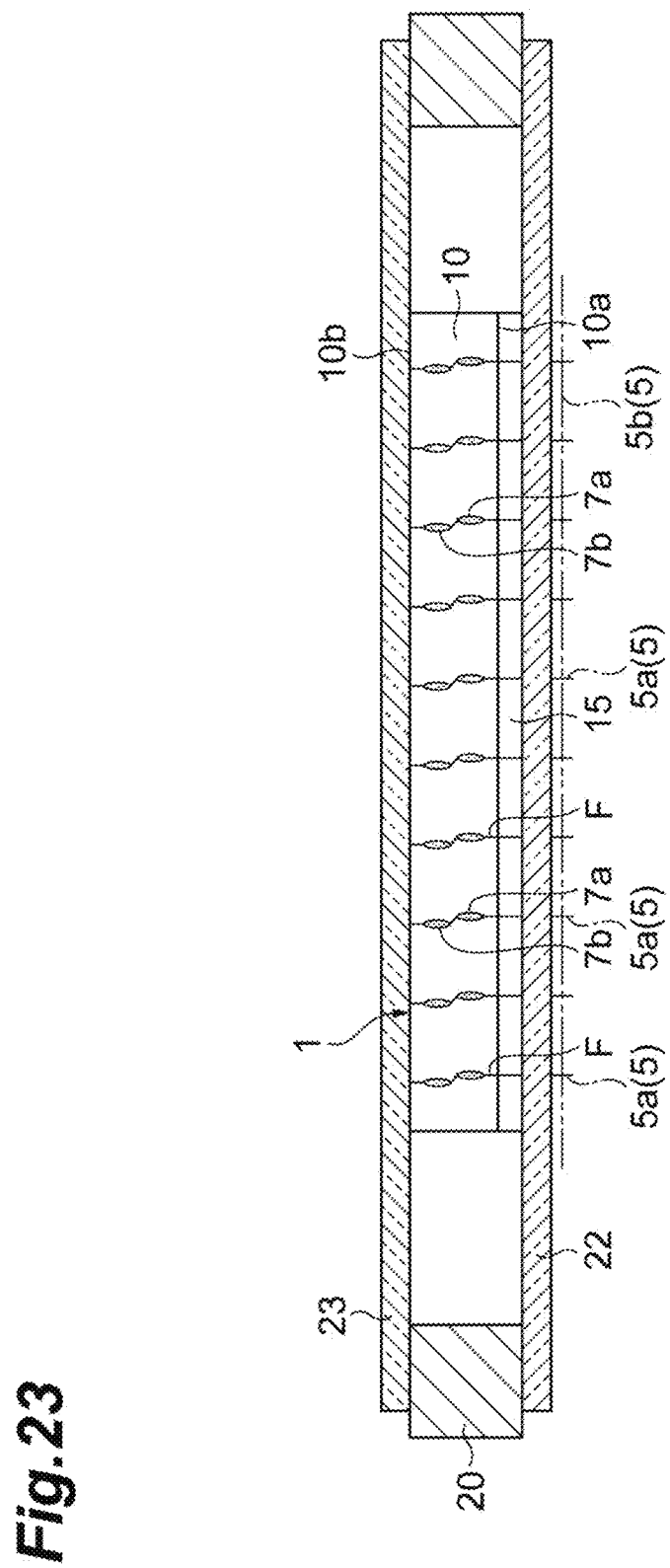
FIG. 23 is a cross-sectional view illustrating the method of manufacturing the semiconductor chip using the laser processing method of the embodiment.
Figure 24:
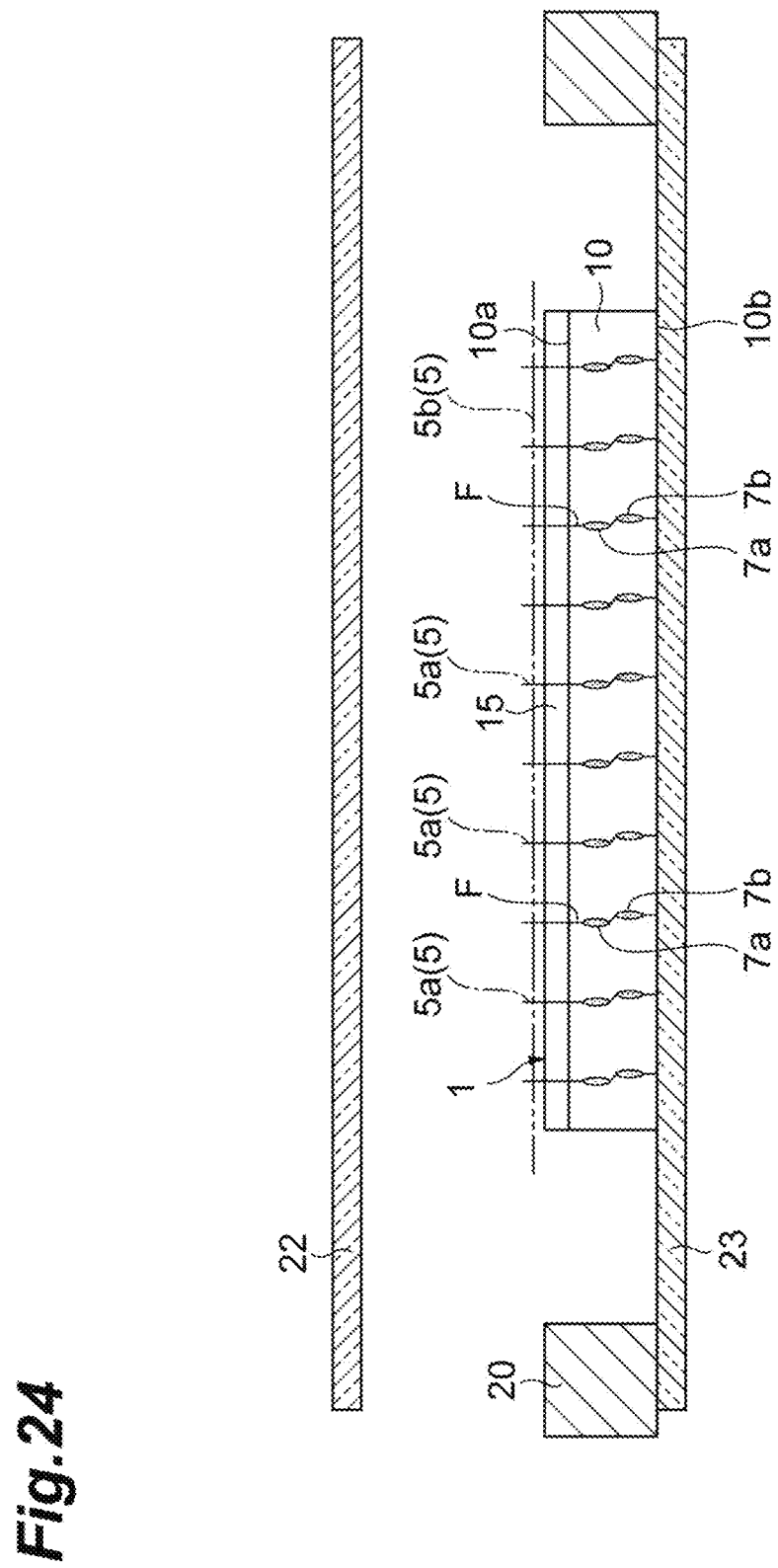
FIG. 24 is a cross-sectional view illustrating the method of manufacturing the semiconductor chip using the laser processing method of the embodiment.
Figure 25:
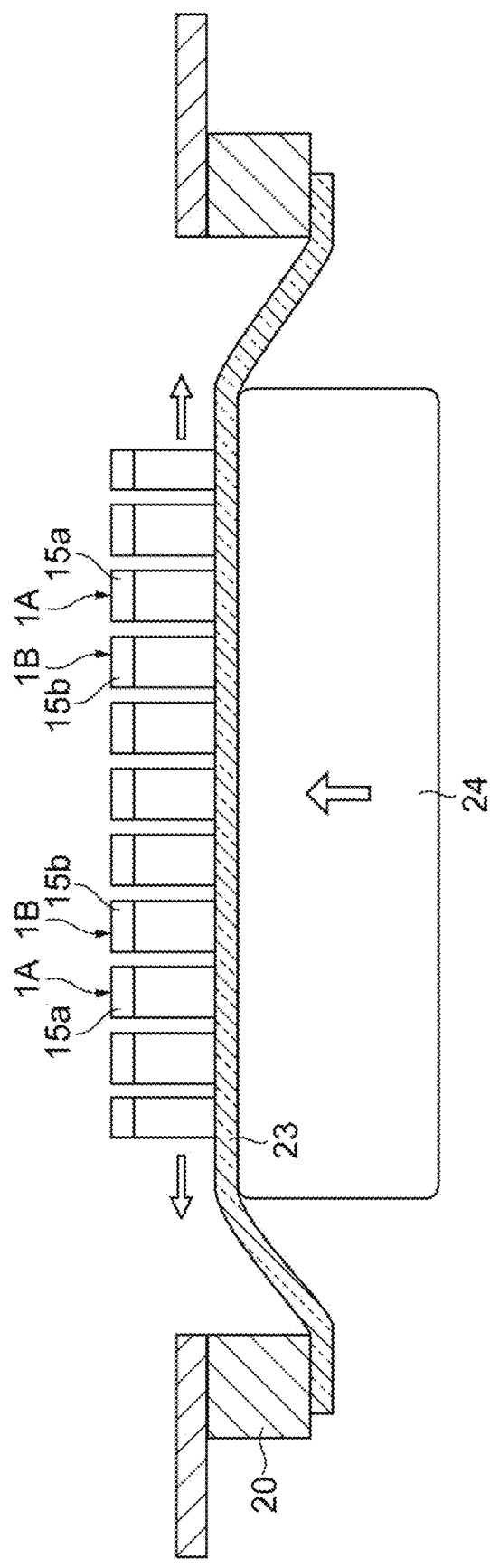
FIG. 25 is a cross-sectional view illustrating the method of manufacturing the semiconductor chip using the laser processing method of the embodiment.
Figure 26:
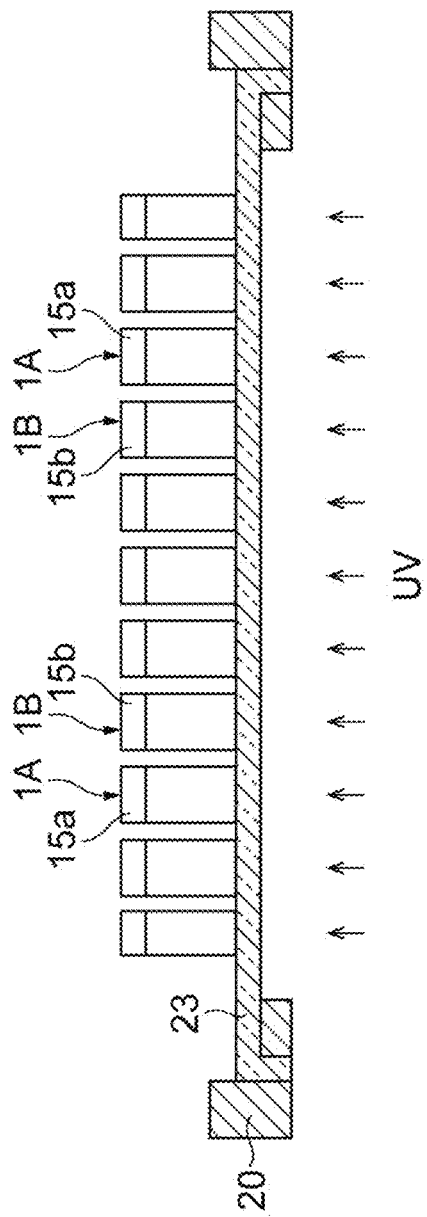
FIG. 26 is a cross-sectional view illustrating the method of manufacturing the semiconductor chip using the laser processing method of the embodiment.

Sequentially, as illustrated in FIG. 23, an expansion film 23 is attached to the back surface 10b of the silicon substrate 10 and the holding member 20. Sequentially, as illustrated in FIG. 24, the protective film 22 is removed. Sequentially, as illustrated in FIG. 25, the object 1 to be processed which is cut for each of the effective regions 15a and the ineffective regions 15b, that is, a plurality of semiconductor chips 1A including the functional elements and an unnecessary chip 1B are spaced apart from each other by pressing a pressing member 24 against the expansion film 23. Sequentially, as illustrated in FIG. 26, an adhesive force of the expansion film 23 is lowered by irradiating the expansion film 23 with ultraviolet rays, and each semiconductor chip 1A is picked up.

Figure 27:
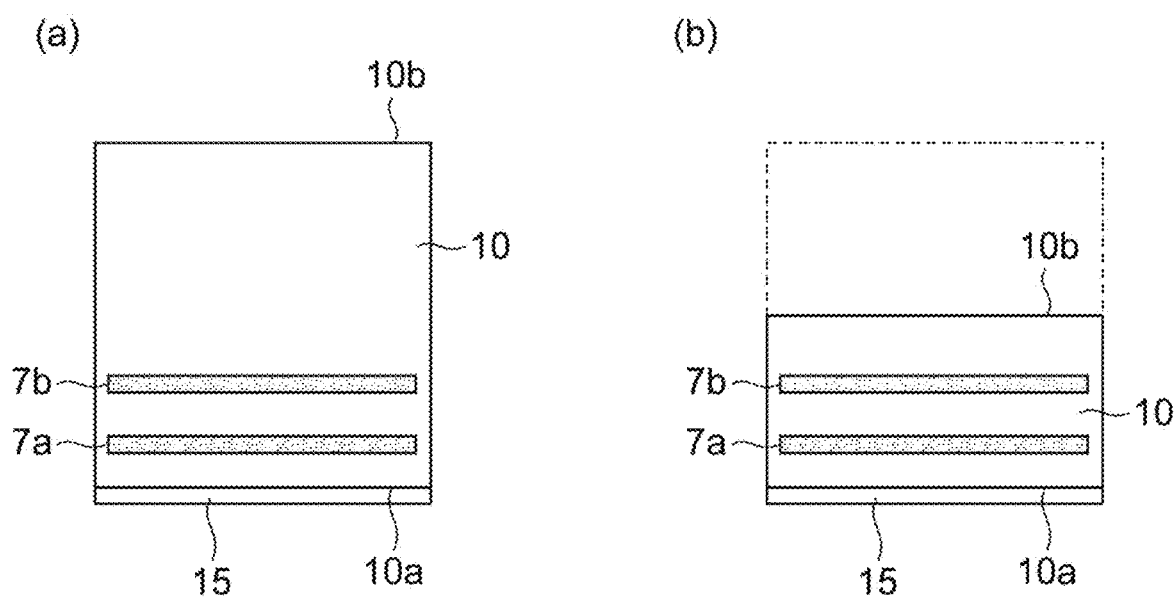
FIG. 27(a) is a cross-sectional view of the object to be processed taken along the cutting line before polishing.
FIG. 27(b) is a cross-sectional view of the object to be processed taken along the cutting line after the polishing.
Figure 28:
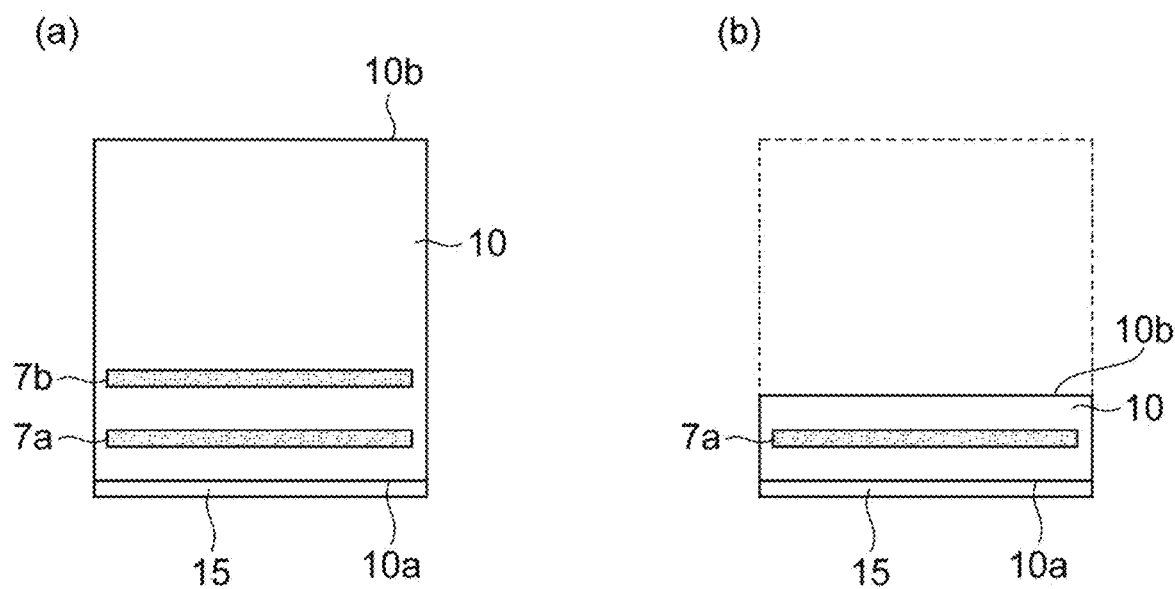
FIG. 28(a) is a cross-sectional view of the object to be processed taken along the cutting line before the polishing.
FIG. 28(b) is a cross-sectional view of the object to be processed taken along the cutting line after the polishing.
Figure 29:
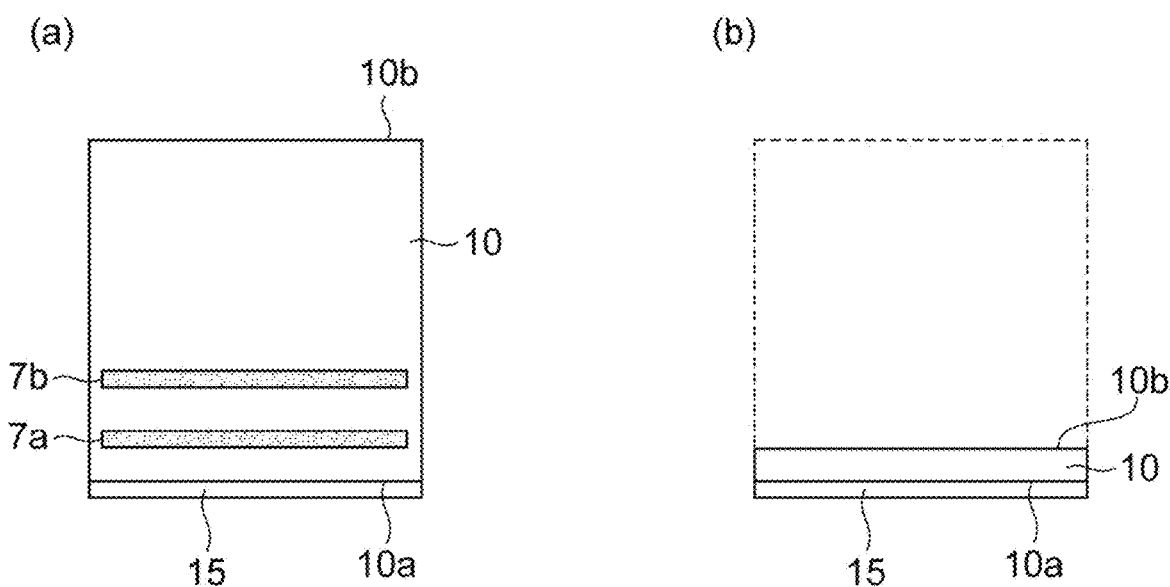
FIG. 29(a) is a cross-sectional view of the object to be processed taken along the cutting line before the polishing.
FIG. 29(b) is a cross-sectional view of the object to be processed taken along the cutting line after the polishing.

Further, when the back surface 10b of the silicon substrate 10 is polished, the back surface 10b of the silicon substrate 10 may be polished so that the first modified region 7a and the second modified region 7b remain as illustrated in FIG. 27, the back surface 10b of the silicon substrate 10 may be polished so that the first modified region 7a remains and the second modified region 7b does not remain as illustrated in FIG. 28, and the back surface 10b of the silicon substrate 10 may be polished so that the first modified region 7a and the second modified region 7b do not remain as illustrated in FIG. 29.

As described above, in the laser processing method and the laser processing device 100 of the embodiment, the second converging point P2 of the laser light L1 is offset in a direction perpendicular to both the thickness direction of the silicon substrate 10 and the extension direction of the cutting line 5a with respect to the position D1 in which the first converging point P1 of the laser light L1 is aligned. Therefore, it is possible to prevent damage (splash S) from occurring on the surface 10a of the object 1 to be processed on the side opposite to the incident surface of the laser light L1. In particular, during processing (second step) along the cutting line 5a, the second converging point P2 is offset toward the effective region 15a side of the position at which the first converging point P1 is aligned. Accordingly, a position at which the splash S may occur on the surface 10a of the object 1 to be processed on the side opposite to the incident surface of the laser light L1 can be shifted to the ineffective region 15b side. That is, the position at which the splash S may occur can be controlled to a position which does not affect the characteristics of the functional element. From the above viewpoint, according to the laser processing method and the laser processing device 100 of the embodiment, deterioration of the characteristics of the functional element can be minimized.

Further, when the laser light L1 having a wavelength larger than 1064 nm is used, as compared with the case of using the laser light L0 having a wavelength of 1064 nm or less, it is possible to greatly extend the crack F in the thickness direction of the silicon substrate 10 from the first modified region 7a and the second modified region 7b as the first modified region 7a and the second modified region 7b are formed.

Further, when the laser light L1 having a wavelength of 1099 µm or more and 1342 µm or less is used, it is possible to more greatly extend the crack F in the thickness direction of the silicon substrate 10 from the first modified region 7a and the second modified region 7b as the first modified region 7a and the second modified region 7b are formed. In particular, the laser light L1 having a wavelength of 1342 μm can extend the crack F more largely.

Further, when the offset amount for offsetting the second converging point P2 of the laser light L1 at the time of forming the second modified region 7b is set to 24 μm or less, the crack F can be securely connected between the first modified region 7a and the second modified region 7b, and thus it is possible to reliably extend the crack F in the thickness direction of the silicon substrate 10 from the first modified region 7a and the second modified region 7b as the first modified region 7a and the second modified region 7b are formed. Furthermore, when the offset amount is 4 μm or more and 18 μm or less, the crack F is more reliably connected between the first modified region 7a and the second modified region 7b, and thus it is possible to extend the crack F more reliably in the thickness direction of the silicon substrate 10 from the first modified region 7a and the second modified region 7b. Particularly, when the offset amount is set to 6 μm or more and 16 μm or less, it is possible to achieve suppression of occurrence of the splash S and connection and extension of the crack F in balance.

Here, as described above, the splash S may occur on the side opposite to the side in which the second converging point P2 of the laser light L1 is offset when the second modified region 7b is formed. Therefore, in the case (second step) in which the second modified region 7b is formed along the cutting line 5a set between the effective region 15a and the ineffective region 15b, the position at which the splash S may occur can be controlled to the ineffective region 15b side by setting an offset direction as described above. Therefore, when the characteristic deterioration of the functional element is suppressed, the requirement to suppress the occurrence itself of the splash S is relatively low. Accordingly, it is necessary and sufficient for the offset amount OA of the second converging point P2 to be within a range of 24 μm or less, particularly 2 μm or more and 8 μm or less. Therefore, since an offset distance between the first modified region 7a and the second modified region 7b is also relatively small, a step difference on the cut surface also becomes small.

On the other hand, in the case in which the second modified region 7b is formed along the cutting line 5b set between the effective regions 15a (fourth step), since both sides of the cutting line 5b are the effective regions 15a, the requirement for suppressing the occurrence itself of the splash S is relatively high. Therefore, in this case, it can be set in the range of 24 μm or less, particularly 4 μm or more and 18 μm or less.

Further, in the laser processing method and the laser processing device 100 of the embodiment, when the first modified region 7a is formed, the first converging point P1 of the laser light L1 is moved along the cutting line 5 while the distance at which the first converging point P1 of the laser light L1 is offset in the direction perpendicular to both the thickness direction of the silicon substrate 10 and the extension direction of the cutting line 5 is maintained to be 0 with respect to the cutting line 5 (cutting lines 5a and 5b) As a result, the crack F extending from the first modified region 7a to the surface 10a side of the silicon substrate 10 can be aligned on the cutting line 5.

Although one embodiment of one aspect of the present invention has been described, one aspect of the present invention is not limited to the above embodiment and may be modified or applied to other aspects without changing the gist described in each claim. For example, when the first modified region 7a is formed, the first converging point P1 of the laser light L1 may be offset with respect to the cutting line 5 to one side in the direction perpendicular to both the thickness direction of the silicon substrate 10 and the extension direction of the cutting line 5, and when the second modified region 7b is formed, the second converging point P2 of the laser light L1 may be offset with respect to the cutting line 5 to the other side in the direction perpendicular to both the thickness direction of the silicon substrate 10 and the extension direction of the cutting line 5. That is, when the first modified region 7a is formed, the first converging point P1 of the laser light L may be moved along the cutting line 5 (parallel to the cutting line 5) while the state in which the first converging point P1 of the laser light L is away from the cutting line 5 by a predetermined distance toward one side when seen from the thickness direction of the silicon substrate 10 is maintained, and when the second modified region 7b is formed, the second converging point P2 of the laser light L may be moved along the cutting line 5 (parallel to the cutting line 5) while the state in which the second converging point P2 of the laser light L is away from the cutting line 5 by a predetermined distance toward the other side when viewed from the thickness direction of the silicon substrate 10 is maintained. Therefore, the first modified region 7a is formed inside the silicon substrate 10 along the cutting line 5 (parallel to the cutting line 5) while being apart from the cutting line 5 to one side by the predetermined distance when seen from the thickness direction of the silicon substrate 10, and the second modified region 7b is formed inside the silicon substrate 10 along the cutting line 5 (parallel to the cutting line 5) while being apart from the cutting line 5 to the other side by the predetermined distance when seen from the thickness direction of the silicon substrate 10. In this case, the first modified region 7a and the second modified region 7b may be formed in balance on one side and the other side of the cutting line 5.

Further, in the embodiment, the forming process (first step) of the first modified region 7a was performed on the cutting line 5a extending in the second direction out of all cutting lines 5 set in the grid pattern, and the forming process (second step) of the second modified region 7b was subsequently performed on cutting line 5a extending in the second direction. Additionally, the forming process (third process) of the first modified region 7a was performed on the cutting line 5b extending in the first direction out of all the cutting lines 5 set in the grid pattern, and then the forming process (fourth process) of the second modified region 7b was performed on the cutting line 5b extending in the first direction.

However, the order of performing the first to fourth processes is not limited to this example. For example, the forming processes (first step and third process) of the first modified region 7a may be performed on all the cutting lines 5 (the cutting lines 5a and 5b) set in the grid pattern, and then the forming processes (second step and fourth process) of the second modified region 7b may be performed on all the cutting lines 5 (the cutting lines 5a and 5b) set in the grid pattern. In addition, the forming process (first step or third process) of the first modified region 7a may be performed for each of the plurality of cutting lines 5, and then the forming process (second step or fourth process) of the second modified region 7b may be performed. That is, the forming process (first step or third process) of the first modified region 7a and the forming process (second step or fourth process) of the second modified region 7b may be performed on one of the cutting lines 5, and the forming process (first step or third process) of the first modified region 7a and the forming process (second step or fourth process) of the second modified region 7b may be performed on the other one cutting line 5.

Further, the object 1 to be processed may include a semiconductor substrate made of another semiconductor material, instead of the silicon substrate 10. In this case, the wavelength of the laser light L1 may not necessarily be larger than 1064 µm (for example, it may be 1064 µm).

In addition, the back surface 10b of the silicon substrate 10 may not be polished after the forming processes (first step and third process) of the first modified region 7a and the forming process (second step and fourth process) of the second modified region 7b. When the thickness of the object 1 to be processed is relatively small with respect to the number of rows of the modified region 7 formed per one cutting line 5, or when the number of rows of the modified region 7 formed per one cutting line 5 is relatively large with respect to the thickness of the object 1 to be processed, the object 1 to be processed may be cut along the cutting line 5 without polishing the back surface 10b of the silicon substrate 10.

It is possible to provide a laser processing method and a laser processing device capable of minimizing the deterioration of the characteristics of the functional element.

REFERENCE SIGNS LIST

1 Object to be processed
5, 5a, 5b cutting line
7a First modified region
7b Second modified region
10 Silicon substrate (semiconductor substrate)
10a Surface
10b Back surface
15a Effective region
15b Ineffective region
100 Laser processing device
101 Laser light source
102 Laser light source control unit (control unit)
105 Converging lens (converging optical system)
107 Support base
115 Stage control unit (control unit)
L1 Laser light
P1 First converging point
P2 Second converging point

The invention claimed is:

1. A laser processing method comprising:
a first step of forming a first modified region along a cutting line by converging laser light on an object to be processed comprising a semiconductor substrate having a surface and a back surface, a plurality of effective regions formed on the surface, and an ineffective region formed on the surface between the effective regions while using the back surface as an incident surface, and moving a first converging point along the cutting line set to pass between the effective region and the ineffective region adjacent to each other while maintaining a distance between the surface and the first converging point of the laser light at a first distance; and
a second step of forming a second modified region along the cutting line after the first step by converging the laser light on the object to be processed while using the back surface as the incident surface and moving a second converging point of the laser light along the cutting line while maintaining a distance between the surface and the second converging point at a second distance larger than the first distance,
wherein the effective region comprises a functional element,
in the second step, the second converging point is moved along the cutting line while the second converging point is offset toward the effective region side of a position at which the first converging point is aligned with respect to a direction perpendicular to both a thickness direction of the semiconductor substrate and an extension direction of the cutting line,
a distance at which the second converging point is offset in the direction perpendicular to both the thickness direction of the semiconductor substrate and the extension direction of the cutting line with respect to the position at which the first converging point is aligned is 2 µm or more and 8 µm or less,
the semiconductor substrate is a silicon substrate, and
the laser light has a wavelength of 1099 µm or more and 1342 µm or less.
2. The laser processing method according to claim 1, wherein, in the first step, the first converging point is moved along the cutting line while a distance at which the first converging point is offset in the direction perpendicular to both the thickness direction of the semiconductor substrate and the extension direction of the cutting line is maintained at 0 with respect to the cutting line.
3. A laser processing device comprising:
a support base configured to support an object to be processed comprising a semiconductor substrate having a surface and a back surface, a plurality of effective regions formed on the surface, and an ineffective region formed on the surface between the effective regions;
a laser light source configured to emit laser light;
a converging optical system configured to converge the laser light emitted from the laser light source on the object to be processed supported by the support base so that the back surface becomes an incident surface; and
a control unit configured to control an operation of at least one of the support base, the laser light source and the converging optical system,
wherein the effective region comprises a functional element,
the control unit moves a first converging point along a cutting line set to pass between the effective region and the ineffective region adjacent to each other while maintaining a distance between the surface and the first converging point of the laser light at a first distance and then moves a second converging point of the laser light along the cutting line while maintaining a distance between the surface and the second converging point at a second distance larger than the first distance and also offsetting the second converging point toward the effective region side of a position at which the first converging point is aligned with respect to a direction perpendicular to both a thickness direction of the semiconductor substrate and an extension direction of the cutting line, and
a distance at which the second converging point is offset in the direction perpendicular to both the thickness direction of the semiconductor substrate and the extension direction of the cutting line with respect to the position at which the first converging point is aligned is 2 µm or more and 8 µm or less,
the semiconductor substrate is a silicon substrate, and
the laser light has a wavelength of 1099 µm or more and 1342 µm or less.

* * * * *